United States Patent
McMillan, III et al.

(10) Patent No.: US 8,424,691 B2
(45) Date of Patent: Apr. 23, 2013

(54) SEISMICALLY HARDENED TWO-POST ELECTRONIC EQUIPMENT RACK

(75) Inventors: William McMillan, III, Austin, TX (US); Ben John Sy, Austin, TX (US); Andrew Ungho Pae, Simi Valley, CA (US)

(73) Assignee: Chatsworth Products, Inc., Westlake Village, CA (US)

( * ) Notice: Subject to any disclaimer, the term of this patent is extended or adjusted under 35 U.S.C. 154(b) by 0 days.

(21) Appl. No.: 13/403,404

(22) Filed: Feb. 23, 2012

(65) Prior Publication Data
US 2012/0145655 A1 Jun. 14, 2012

Related U.S. Application Data

(63) Continuation of application No. 12/468,865, filed on May 19, 2009, now abandoned.

(60) Provisional application No. 61/054,457, filed on May 19, 2008, provisional application No. 61/059,738, filed on Jun. 6, 2008.

(51) Int. Cl.
*A47F 7/00* (2006.01)
*H05K 5/00* (2006.01)

(52) U.S. Cl.
USPC ............... 211/26; 174/50; 361/826

(58) Field of Classification Search .......... 211/26, 211/175, 189, 183, 190, 191, 192, 204, 206; 312/265.1–265.4; 361/826; 174/50, 100; 385/134, 135
See application file for complete search history.

(56) References Cited

U.S. PATENT DOCUMENTS 2,424,217 A 7/1947 Bales
2,740,944 A 4/1956 Harrison et al.
(Continued)

FOREIGN PATENT DOCUMENTS

CN 102177633 A 9/2011
DE 19615759 A1 10/1997
(Continued)

OTHER PUBLICATIONS

Information Disclosure Statement (IDS) Letter Regarding Common Patent Application(s), dated Apr. 27, 2012.
(Continued)

*Primary Examiner* — Darnell Jayne
*Assistant Examiner* — Joshua Rodden
(74) *Attorney, Agent, or Firm* — Tillman Wright, PLLC; James D. Wright; David R. Higgins

(57) ABSTRACT

A two-post mounting rack includes a frame bottom, a frame top, a pair of frame uprights interconnected between the frame bottom and the frame top, and a base assembly for supporting the frame bottom on a surface. One or more of the frame bottom, the frame top, the pair of frame uprights, and the base assembly are seismically hardened. Each frame upright has a closed cross-sectional shape. Each frame upright includes a flange with apertures adapted to provide a mounting location for cable management projections. The base assembly includes two separate end gusset members. Each end gusset member includes two corner gussets. Each corner gusset includes a floor plate and a riser plate. The two corner gussets in each end gusset member are connected by a bridge member. The frame top includes an upper cross-member and two lateral reinforcement plates.

12 Claims, 18 Drawing Sheets

U.S. PATENT DOCUMENTS

| | | | |
|---|---|---|---|
| 3,034,844 A * | 5/1962 | Anderson et al. | 312/265.4 |
| 3,247,312 A | 4/1966 | Allessi | |
| 3,265,419 A | 8/1966 | Durnbaugh et al. | |
| 3,403,220 A | 9/1968 | Riedel et al. | |
| 3,404,931 A * | 10/1968 | Fall et al. | 312/265.4 |
| 3,563,627 A * | 2/1971 | Whipps | 312/265.2 |
| 3,602,373 A | 8/1971 | Cassel | |
| 3,859,767 A | 1/1975 | Aspenwall | |
| 3,919,603 A | 11/1975 | Salvati et al. | |
| 3,966,285 A | 6/1976 | Porch et al. | |
| 4,045,104 A | 8/1977 | Peterson | |
| 4,148,453 A | 4/1979 | Brantly | |
| 4,470,102 A | 9/1984 | De Luca et al. | |
| 4,497,411 A * | 2/1985 | DeBortoli | 211/26 |
| 4,553,674 A | 11/1985 | Yoshikawa et al. | |
| 4,592,602 A | 6/1986 | Kuster et al. | |
| 4,641,754 A | 2/1987 | Hebel et al. | |
| 4,643,319 A * | 2/1987 | Debus et al. | 211/189 |
| 4,675,900 A | 6/1987 | Temkin | |
| 4,899,892 A | 2/1990 | Rheault | |
| 4,964,020 A | 10/1990 | Savage et al. | |
| 4,988,008 A | 1/1991 | Blum et al. | |
| 4,997,240 A | 3/1991 | Schmalzl et al. | |
| 5,004,107 A | 4/1991 | Sevier et al. | |
| 5,066,161 A | 11/1991 | Pinney | |
| 5,141,185 A | 8/1992 | Rumbold et al. | |
| 5,165,770 A | 11/1992 | Hahn | |
| 5,228,762 A | 7/1993 | Mascrier | |
| 5,233,129 A | 8/1993 | Hall | |
| RE34,393 E | 9/1993 | McIlwraith | |
| 5,250,752 A | 10/1993 | Cutright | |
| 5,284,254 A | 2/1994 | Rinderer | |
| 5,323,916 A | 6/1994 | Salmon | |
| 5,326,934 A | 7/1994 | LeMaster et al. | |
| 5,333,950 A | 8/1994 | Zachrai | |
| 5,372,262 A | 12/1994 | Benson et al. | |
| 5,380,083 A | 1/1995 | Jones et al. | |
| 5,383,723 A | 1/1995 | Meyer | |
| 5,386,959 A | 2/1995 | Laughlin et al. | |
| D360,189 S | 7/1995 | Orlando | |
| 5,441,337 A | 8/1995 | Mazura et al. | |
| 5,536,079 A | 7/1996 | Kostic | |
| 5,540,339 A | 7/1996 | Lerman | |
| 5,542,549 A | 8/1996 | Siemon et al. | |
| 5,566,836 A | 10/1996 | Lerman | |
| 5,586,012 A | 12/1996 | Lerman | |
| 5,593,046 A | 1/1997 | Katsuura et al. | |
| 5,639,150 A | 6/1997 | Anderson et al. | |
| 5,640,482 A * | 6/1997 | Barry et al. | 385/135 |
| 5,683,001 A | 11/1997 | Masuda et al. | |
| 5,695,263 A | 12/1997 | Simon et al. | |
| 5,713,651 A | 2/1998 | Essig et al. | |
| 5,749,476 A | 5/1998 | Besserer et al. | |
| 5,769,519 A | 6/1998 | Nicolai | |
| 5,788,087 A | 8/1998 | Orlando | |
| 5,788,348 A | 8/1998 | Ramachandran et al. | |
| 5,791,498 A | 8/1998 | Mills | |
| 5,806,687 A | 9/1998 | Ballesteros et al. | |
| 5,806,945 A * | 9/1998 | Anderson et al. | 312/265.3 |
| 5,819,956 A | 10/1998 | Rinderer | |
| 5,848,500 A | 12/1998 | Kirk | |
| 5,899,545 A | 5/1999 | Besserer et al. | |
| 5,901,033 A | 5/1999 | Crawford et al. | |
| 5,902,961 A | 5/1999 | Viklund et al. | |
| 5,934,485 A | 8/1999 | Harris et al. | |
| 5,975,315 A | 11/1999 | Jordan | |
| 5,979,672 A | 11/1999 | Gemra et al. | |
| 5,983,590 A | 11/1999 | Serban | |
| 6,005,188 A | 12/1999 | Teichler et al. | |
| 6,006,925 A | 12/1999 | Sevier | |
| 6,017,104 A | 1/2000 | Foschino et al. | |
| 6,019,446 A | 2/2000 | Laboch et al. | |
| 6,021,047 A | 2/2000 | Lopez et al. | |
| 6,036,290 A | 3/2000 | Jancsek et al. | |
| 6,039,420 A | 3/2000 | Besserer et al. | |
| 6,065,612 A | 5/2000 | Rinderer | |
| 6,102,214 A * | 8/2000 | Mendoza | 211/26 |
| 6,123,203 A | 9/2000 | Gibbons | |
| 6,123,400 A | 9/2000 | Nicolai et al. | |
| D433,615 S | 11/2000 | Neider et al. | |
| 6,179,133 B1 | 1/2001 | Reece | |
| D438,177 S | 2/2001 | Rogers | |
| 6,185,092 B1 | 2/2001 | Landrum et al. | |
| 6,201,919 B1 * | 3/2001 | Puetz et al. | 385/134 |
| 6,202,860 B1 | 3/2001 | Ludwig | |
| D440,210 S | 4/2001 | Larsen et al. | |
| 6,213,577 B1 | 4/2001 | Rooyakkers et al. | |
| 6,223,908 B1 | 5/2001 | Kurtsman | |
| 6,231,142 B1 | 5/2001 | Pochet | |
| 6,238,029 B1 * | 5/2001 | Marzec et al. | 312/265.3 |
| 6,240,687 B1 | 6/2001 | Chong | |
| 6,245,998 B1 | 6/2001 | Curry et al. | |
| 6,279,756 B1 | 8/2001 | Walter | |
| 6,282,854 B1 | 9/2001 | Vos et al. | |
| 6,299,268 B1 | 10/2001 | Carle et al. | |
| 6,301,837 B1 | 10/2001 | Ray | |
| 6,321,917 B1 | 11/2001 | Mendoza | |
| 6,338,413 B1 | 1/2002 | Walter et al. | |
| 6,347,714 B1 * | 2/2002 | Fournier et al. | 211/26 |
| 6,349,837 B1 * | 2/2002 | Serban | 211/26 |
| 6,365,834 B1 * | 4/2002 | Larsen et al. | 174/100 |
| 6,386,120 B1 | 5/2002 | Nelson et al. | |
| 6,401,940 B1 | 6/2002 | Hartel et al. | |
| 6,419,331 B2 | 7/2002 | Wei | |
| 6,422,399 B1 | 7/2002 | Castillo et al. | |
| 6,425,488 B1 | 7/2002 | Notohardjono et al. | |
| 6,425,648 B1 | 7/2002 | Notohardjono et al. | |
| 6,467,633 B1 | 10/2002 | Mendoza | |
| 6,468,112 B1 | 10/2002 | Follingstad et al. | |
| 6,478,166 B2 | 11/2002 | Hung | |
| 6,481,582 B1 | 11/2002 | Rinderer | |
| 6,489,565 B1 * | 12/2002 | Krietzman et al. | 174/101 |
| 6,517,174 B2 * | 2/2003 | Sevier | 312/257.1 |
| 6,527,351 B1 | 3/2003 | Sevier et al. | |
| 6,541,705 B1 | 4/2003 | McGrath | |
| 6,554,142 B2 | 4/2003 | Gray | |
| 6,561,602 B1 | 5/2003 | Sevier et al. | |
| 6,584,267 B1 | 6/2003 | Caveney et al. | |
| 6,598,270 B2 | 7/2003 | Larsen et al. | |
| 6,600,107 B1 * | 7/2003 | Wright et al. | 174/72 A |
| 6,601,349 B1 | 8/2003 | Corden | |
| 6,605,777 B1 | 8/2003 | Anderson et al. | |
| 6,605,782 B1 | 8/2003 | Krietzman et al. | |
| 6,613,981 B1 | 9/2003 | Hathcock et al. | |
| 6,614,978 B1 | 9/2003 | Caveney et al. | |
| 6,629,614 B2 | 10/2003 | Jordan | |
| 6,655,533 B2 | 12/2003 | Guebre-Tsadik | |
| 6,702,125 B2 | 3/2004 | Hartel | |
| 6,708,830 B2 | 3/2004 | Mendoza | |
| 6,785,459 B2 * | 8/2004 | Schmidt et al. | 385/134 |
| 6,788,535 B2 | 9/2004 | Dodgen et al. | |
| 6,796,438 B2 * | 9/2004 | Mendoza | 211/26 |
| 6,814,244 B1 | 11/2004 | Hathcock | |
| 6,866,541 B2 | 3/2005 | Barker et al. | |
| 6,889,853 B2 | 5/2005 | Hudz et al. | |
| 6,915,616 B2 | 7/2005 | Fontana et al. | |
| 6,918,796 B2 | 7/2005 | Elliot et al. | |
| 6,946,605 B2 | 9/2005 | Levesque et al. | |
| 6,951,288 B2 | 10/2005 | Henderson | |
| 6,964,588 B2 | 11/2005 | Follingstad et al. | |
| 6,968,647 B2 | 11/2005 | Levesque et al. | |
| 6,981,893 B2 | 1/2006 | Barker et al. | |
| 7,000,784 B2 * | 2/2006 | Canty et al. | 211/26 |
| 7,014,051 B2 | 3/2006 | Rumney | |
| 7,019,213 B1 * | 3/2006 | McNutt et al. | 174/68.1 |
| 7,026,553 B2 | 4/2006 | Levesque et al. | |
| 7,083,051 B2 | 8/2006 | Smith et al. | |
| 7,090,315 B1 | 8/2006 | Horne | |
| 7,119,282 B2 * | 10/2006 | Krietzman et al. | 174/101 |
| 7,142,765 B2 | 11/2006 | Rapp et al. | |
| 7,178,679 B2 | 2/2007 | Canty et al. | |
| 7,188,735 B2 | 3/2007 | Nakagawa et al. | |
| 7,219,809 B2 * | 5/2007 | Schluter et al. | 211/189 |
| 7,220,150 B2 | 5/2007 | Follingstad et al. | |
| 7,225,586 B2 | 6/2007 | Levesque et al. | |
| 7,229,050 B2 | 6/2007 | Schloss | |
| 7,259,326 B2 | 8/2007 | Nguyen | |

| | | |
|---|---|---|
| 7,285,027 B2 | 10/2007 | McGrath et al. |
| 7,362,941 B2 | 4/2008 | Rinderer et al. |
| 7,364,243 B2 | 4/2008 | Wyatt et al. |
| 7,378,046 B2 | 5/2008 | Canty et al. |
| 7,381,100 B2 | 6/2008 | Follingstad et al. |
| 7,417,188 B2 | 8/2008 | McNutt et al. |
| 7,425,678 B2 | 9/2008 | Adducci et al. |
| 7,427,713 B2 | 9/2008 | Adducci et al. |
| 7,437,048 B2 | 10/2008 | Farrell et al. |
| 7,448,168 B2 | 11/2008 | Waalkes et al. |
| 7,458,859 B2 * | 12/2008 | McGrath et al. ............... 439/701 |
| 7,485,803 B2 | 2/2009 | Adducci et al. |
| 7,495,169 B2 | 2/2009 | Adducci et al. |
| 7,504,581 B2 | 3/2009 | Adducci et al. |
| 7,687,716 B2 | 3/2010 | Pepe et al. |
| 7,697,285 B2 | 4/2010 | Donowho et al. |
| 7,718,891 B2 * | 5/2010 | Adducci et al. ................. 174/50 |
| 7,746,637 B2 | 6/2010 | Donowho et al. |
| 7,762,405 B2 * | 7/2010 | Vogel et al. ...................... 211/26 |
| 7,772,489 B2 | 8/2010 | Adducci et al. |
| 7,778,513 B2 | 8/2010 | Rinderer et al. |
| 7,839,635 B2 | 11/2010 | Donowho et al. |
| 7,874,433 B2 | 1/2011 | Levesque et al. |
| 7,880,084 B2 * | 2/2011 | Adducci et al. ................. 174/50 |
| 7,939,763 B2 * | 5/2011 | Jones et al. .................... 174/101 |
| 7,973,242 B2 * | 7/2011 | Jones et al. .................... 174/100 |
| 7,974,105 B2 | 7/2011 | Dean, Jr. et al. |
| 8,003,890 B2 | 8/2011 | Donowho et al. |
| 8,035,965 B2 | 10/2011 | Adducci et al. |
| 2002/0046979 A1 | 4/2002 | Larsen et al. |
| 2002/0100737 A1 | 8/2002 | Walter et al. |
| 2002/0100738 A1 | 8/2002 | Walter et al. |
| 2002/0117462 A1 | 8/2002 | Hung |
| 2003/0072551 A1 | 4/2003 | Douglas et al. |
| 2003/0118311 A1 * | 6/2003 | Thibault et al. ............... 385/134 |
| 2003/0190036 A1 * | 10/2003 | Mandoza ....................... 379/327 |
| 2004/0007372 A1 * | 1/2004 | Krietzman et al. ............. 174/50 |
| 2004/0016708 A1 * | 1/2004 | Rafferty et al. ................. 211/26 |
| 2004/0016713 A1 * | 1/2004 | Wyatt et al. ................... 211/183 |
| 2004/0020873 A1 | 2/2004 | Henderson |
| 2004/0069725 A1 | 4/2004 | Adducci et al. |
| 2004/0094491 A1 | 5/2004 | Smith et al. |
| 2004/0146266 A1 * | 7/2004 | Solheid et al. ................. 385/135 |
| 2004/0173545 A1 | 9/2004 | Canty et al. |
| 2004/0183409 A1 | 9/2004 | Rinderer |
| 2004/0226900 A1 | 11/2004 | Canty et al. |
| 2005/0115737 A1 * | 6/2005 | Levesque et al. ............. 174/100 |
| 2005/0221683 A1 | 10/2005 | McGrath et al. |
| 2005/0247650 A1 | 11/2005 | Vogel et al. |
| 2006/0043031 A1 * | 3/2006 | Rinderer ......................... 211/26 |
| 2006/0091086 A1 | 5/2006 | Canty et al. |
| 2006/0162948 A1 * | 7/2006 | Rinderer et al. ................ 174/50 |
| 2006/0174580 A1 | 8/2006 | Quertelet et al. |
| 2006/0213853 A1 * | 9/2006 | Schluter et al. ............... 211/189 |
| 2006/0243680 A1 | 11/2006 | Levesque et al. |
| 2007/0144981 A1 | 6/2007 | Nguyen |
| 2007/0144982 A1 | 6/2007 | Nguyen |
| 2007/0210679 A1 | 9/2007 | Adducci et al. |
| 2007/0210680 A1 * | 9/2007 | Appino et al. ................. 312/7.2 |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0212010 A1 * | 9/2007 | Caveney ....................... 385/135 |
| 2007/0221393 A1 | 9/2007 | Adducci et al. |
| 2007/0249237 A1 | 10/2007 | Follingstad et al. |
| 2008/0035810 A1 | 2/2008 | Lewis, II |
| 2008/0037228 A1 | 2/2008 | Lewis, II |
| 2008/0130262 A1 | 6/2008 | Rinderer et al. |
| 2008/0151524 A1 | 6/2008 | Kelly et al. |
| 2008/0174217 A1 | 7/2008 | Walker |
| 2008/0209827 A1 | 9/2008 | Webb |
| 2008/0316702 A1 | 12/2008 | Donowho et al. |
| 2008/0316703 A1 | 12/2008 | Donowho et al. |
| 2009/0014614 A1 * | 1/2009 | Warmoth et al. .......... 248/309.1 |
| 2009/0061755 A1 | 3/2009 | Calder et al. |
| 2009/0090533 A1 | 4/2009 | Jones et al. |
| 2009/0090538 A1 | 4/2009 | Jones et al. |
| 2009/0093169 A1 | 4/2009 | McGrath et al. |
| 2009/0129013 A1 | 5/2009 | Donowho et al. |
| 2009/0224110 A1 | 9/2009 | Donowho et al. |
| 2009/0227197 A1 | 9/2009 | Lewis, II et al. |
| 2009/0236117 A1 | 9/2009 | Garza et al. |
| 2009/0273915 A1 | 11/2009 | Dean, Jr. et al. |
| 2009/0283488 A1 | 11/2009 | McMillan, III et al. |
| 2010/0193754 A1 | 8/2010 | Garza et al. |
| 2010/0200707 A1 | 8/2010 | Garza et al. |
| 2011/0056895 A1 * | 3/2011 | Tichy ............................. 211/26 |
| 2011/0148261 A1 | 6/2011 | Donowho et al. |
| 2011/0211328 A1 | 9/2011 | Dean, Jr. et al. |
| 2011/0211329 A1 | 9/2011 | Dean, Jr. et al. |
| 2012/0062083 A1 | 3/2012 | Lewis, II et al. |
| 2012/0062084 A1 | 3/2012 | Lewis, II et al. |
| 2012/0062086 A1 | 3/2012 | Garza, Jr. et al. |
| 2012/0062091 A1 | 3/2012 | Donowho et al. |
| 2012/0063099 A1 | 3/2012 | Alaniz et al. |
| 2012/0112612 A1 | 5/2012 | Krietzman |

FOREIGN PATENT DOCUMENTS

| | | |
|---|---|---|
| EP | 0577433 | 1/1994 |
| EP | 2429271 | 3/2012 |
| EP | 2429272 | 3/2012 |
| WO | 9948305 | 9/1999 |
| WO | 0101533 A1 | 1/2001 |
| WO | 2005112477 A1 | 11/2005 |
| WO | 2008022058 A2 | 2/2008 |
| WO | 2008022058 A3 | 11/2008 |
| WO | 2008144678 A1 | 11/2008 |
| WO | 2009089008 A2 | 7/2009 |
| WO | 2009089306 A1 | 7/2009 |
| WO | 2009089306 A4 | 7/2009 |
| WO | 2009103090 A2 | 8/2009 |
| WO | 2009103090 A3 | 10/2009 |
| WO | 2009143193 A2 | 11/2009 |

OTHER PUBLICATIONS

"International Search Report" and "Written Opinion of the International Searching Authority" (ISA/US ) in Chatsworth Products, Inc. et al., International Patent Application Serial No. PCT/US2007/75763, Aug. 13, 2008, 13 pages.

"International Search Report" and "Written Opinion of the International Search Authority" (European Patent Office) in Corning Cable Systems LLC, International Patent Application Serial No. PCT/US2009/000075, dated Aug. 7, 2009, 21 pages.

"International Search Report" and "Written Opinion of the International Search Authority" (Korean Intellectual Property Office) in Chatsworth Products, Inc. et al., International Patent Application No. PCT/US2009/044577, dated Jan. 12, 2010, 7 pages.

* cited by examiner

SEISMICALLY HARDENED TWO-POST ELECTRONIC EQUIPMENT RACK

CROSS-REFERENCE TO RELATED APPLICATION

The present application is a U.S. continuation patent application of, and claims priority under 35 U.S.C. §120 to, U.S. nonprovisional patent application Ser. No. 12/468,865, filed May 19, 2009 now abandoned and published as U.S. Patent Application Publication No. US 2009/0283488 A1, which '865 application is a U.S. nonprovisional patent application of, and claims priority under 35 U.S.C. §119(e) to, U.S. provisional patent application Ser. No. 61/054,457, filed May 19, 2008, and U.S. provisional patent application Ser. No. 61/059,738, filed Jun. 6, 2008. Each of the foregoing U.S. patent applications and U.S. patent application publications is expressly incorporated by reference herein in its entirety.

INCORPORATION BY REFERENCE

Additionally, each of the following U.S. patents or U.S. patent applications is expressly incorporated by reference herein in its entirety:
(a) U.S. Pat. No. 6,394,398 to Reed et al.;
(b) U.S. Pat. No. 7,119,282 to Krietzman, et al.; and
(c) U.S. Provisional Patent Application No. 61/020,745 to Garza et al., filed Jan. 14, 2008 and entitled "CABLE MANAGEMENT SYSTEM."

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

1. Field of the Present Invention

The present invention relates generally to two-post mounting racks, and, in particular, to seismically hardened two-post electronic equipment racks.

2. Background

Two-post mounting racks for electronic equipment are well known. However, many two-post mounting racks are vulnerable to seismic events. Prior art solutions to this problem are bulky, heavy, consume large areas of floor space, and/or are ineffective. Thus, an improved seismically hardened two-post electronic equipment rack is needed.

A further problem is that cables cannot be routed through a raised floor beneath such a rack in the footprint of the rack. Thus, a seismically hardened two-post electronic equipment rack that allows cables to be routed through its footprint is needed.

A still further problem is that seismic spacing requirements create, in some implementations, unused space between adjacent racks. Because of the importance of using all available space, a need exists for a rack that allows such space to be utilized.

SUMMARY OF THE PRESENT INVENTION

The present invention comprises a two-post mounting rack. Broadly defined, the present invention according to one aspect includes a frame bottom, a frame top, a pair of frame uprights interconnected between the frame bottom and the frame top, and a base assembly for supporting the frame bottom on a surface. In features of this aspect, one or more of the frame bottom, the frame top, the pair of frame uprights, and the base assembly are seismically hardened.

The present invention according to another aspect is a seismically hardened two-post mounting rack substantially as shown and described.

The present invention according to another aspect is a mounting rack system substantially as shown and described.

Broadly defined, the present invention according to another aspect includes a seismically hardened two-post mounting rack having a frame bottom, a frame top, and a pair of frame uprights interconnected between the frame bottom and the frame top. Each frame upright has a closed cross-sectional shape.

In features of this aspect, each frame upright may include a box beam; the closed cross-sectional shape may be fabricated by welding together an inner channel member and an outer channel member; each of the inner and outer channel members may be generally U-shaped in cross section; the inner and outer channel members may jointly define the closed cross-sectional shape; the inner channel member may have wings extending outwardly at either side of the U shape of the inner channel member at an angle that is generally perpendicular to opposing sides of the U shape; the wings may be welded to the interior base of the U shape of the outer channel member to define the closed cross-sectional shape; the seismically hardened two-post mounting rack may further include a base assembly for supporting the frame bottom on a surface; the seismically hardened two-post mounting rack may further include a power outlet attached to the frame bottom; the seismically hardened two-post mounting rack may further include a power strip attached to a frame upright; the seismically hardened two-post mounting rack may further include one or more cable guides attached to a frame upright; and the seismically hardened two-post mounting rack may further include a cable raceway attached to the frame top.

Broadly defined, the present invention according to another aspect includes a seismically hardened two-post mounting rack having a frame bottom, a frame top, and a pair of frame uprights interconnected between the frame bottom and the frame top. Each frame upright includes a flange with apertures adapted to provide a mounting location for cable management projections.

In features of this aspect, the flange may be disposed at a distance forward from the main portion of the frame upright; the seismically hardened two-post mounting rack may further include a base assembly for supporting the frame bottom on a surface; the seismically hardened two-post mounting rack may further include a power outlet attached to the frame bottom; the seismically hardened two-post mounting rack may further include a power strip attached to a frame upright; the seismically hardened two-post mounting rack may further include one or more cable guides attached to a frame upright; and the seismically hardened two-post mounting rack may further include a cable raceway attached to the frame top.

Broadly defined, the present invention according to another includes a seismically hardened two-post mounting rack having a frame bottom, a frame top, a pair of frame uprights interconnected between the frame bottom and the frame top, and a base assembly for supporting the frame bottom on a surface. The base assembly includes two separate end gusset members.

In features of this aspect, each end gusset member may include two corner gussets; each corner gusset may include a floor plate and a riser plate; each floor plate may have an anchor plate attached thereto; the floor plates and anchor plates may each have a slot therein that are aligned with one another; the riser plates may extend upwardly relative to the floor plate; portions of the riser plates may be welded to an adjacent frame upright; the two corner gussets in each end gusset member may be connected by a bridge member; the seismically hardened two-post mounting rack may further include a power outlet attached to the frame bottom; the seismically hardened two-post mounting rack may further include a power strip attached to a frame upright; the seismically hardened two-post mounting rack may further include one or more cable guides attached to a frame upright; and the seismically hardened two-post mounting rack may further include a cable raceway attached to the frame top.

Broadly defined, the present invention according to another aspect includes a seismically hardened two-post mounting rack having a frame bottom, a frame top, and a pair of frame uprights interconnected between the frame bottom and the frame top. The frame top includes an upper cross-member and two lateral reinforcement plates.

In features of this aspect, the seismically hardened two-post mounting rack may further include a series of welded, interlocking tabs and slots along the upper cross-member, the lateral reinforcement plates, and the upper end of each frame upright; the seismically hardened two-post mounting rack may further include a power outlet attached to the frame bottom; the seismically hardened two-post mounting rack may further include a power strip attached to a frame upright; the seismically hardened two-post mounting rack may further include one or more cable guides attached to a frame upright; and the seismically hardened two-post mounting rack may further include a cable raceway attached to the frame top.

The present invention according to another aspect is a mounting rack system including a first two-post mounting rack, having a frame bottom, a frame top, and a pair of frame uprights interconnected between the frame bottom and the frame top; and a second two-post mounting rack disposed next to the first two-post mounting rack, having a frame bottom, a frame top, and a pair of frame uprights interconnected between the frame bottom and the frame top; wherein cable management projections are mounted on the frame upright, in the first two-post mounting rack, that is closest to the second two-post mounting rack, and cable management projections are mounted on the frame upright, in the second two-post mounting rack, that is closest to the first two-post mounting rack; and wherein a space is established between (i) the frame upright, in the first two-post mounting rack, that is closest to the second two-post mounting rack, and (ii) the frame upright, in the second two-post mounting rack, that is closest to the first two-post mounting rack; such that a virtual vertical cable manager is created between the first and second two-post mounting racks.

The present invention according to still another aspect is a mounting rack system including: a first two-post mounting rack; a second two-post mounting rack, disposed laterally adjacent to, but spaced apart from, the first two-post mounting rack; and a virtual vertical cable manager, created by and between the first and second adjacent two-post mounting racks.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
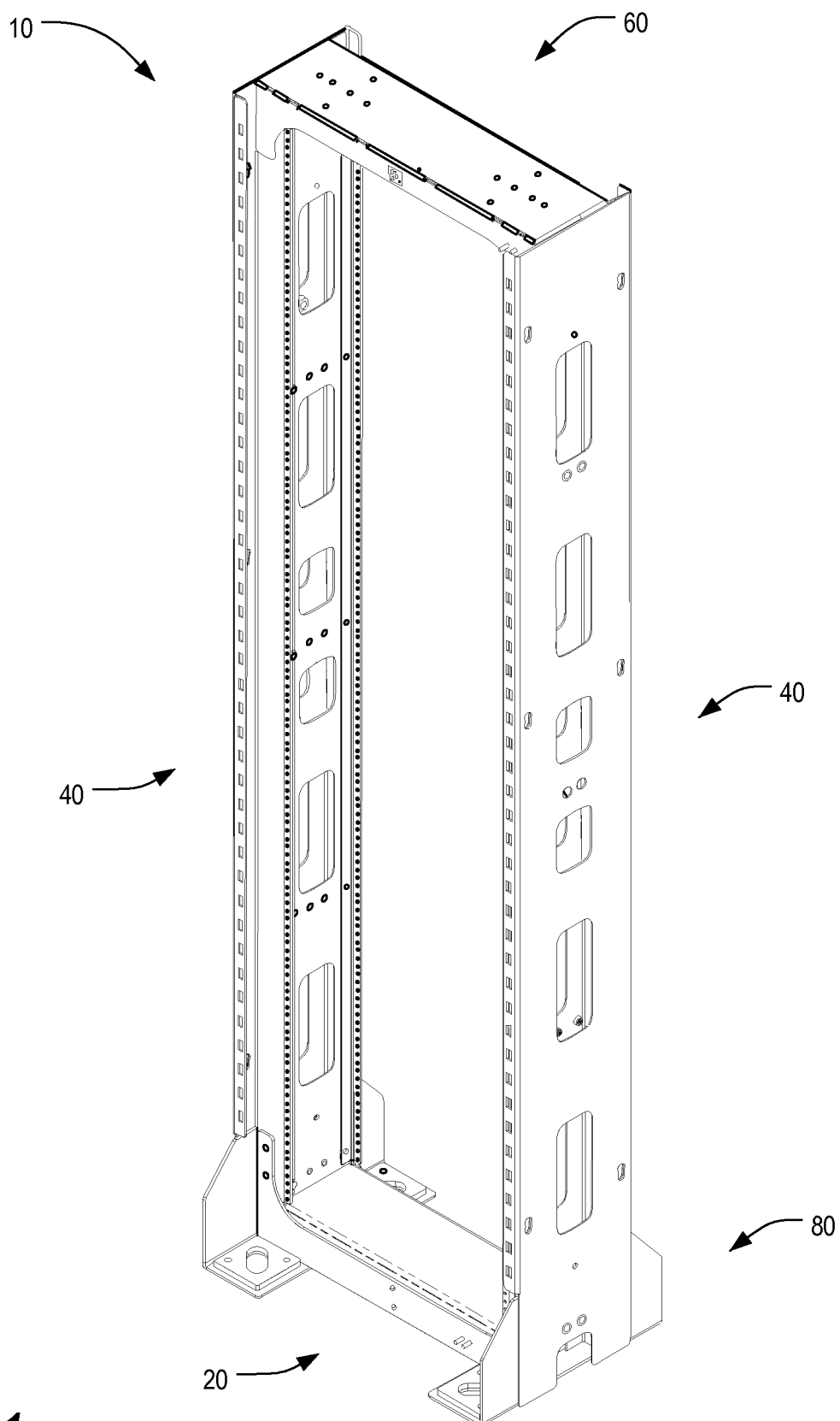
FIG. 1 is a top isometric view of a two-post mounting rack in accordance with a preferred embodiment of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Also, as used herein, "welding" and "welded" generally denote the use of any suitable type of conventional weld or welding technique, particularly including, but not limited to, skip welding, continuous welding, fill welding and plug welding, either alone, in combination with one other or in combination with other welds or welding techniques.

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

Figure 2:
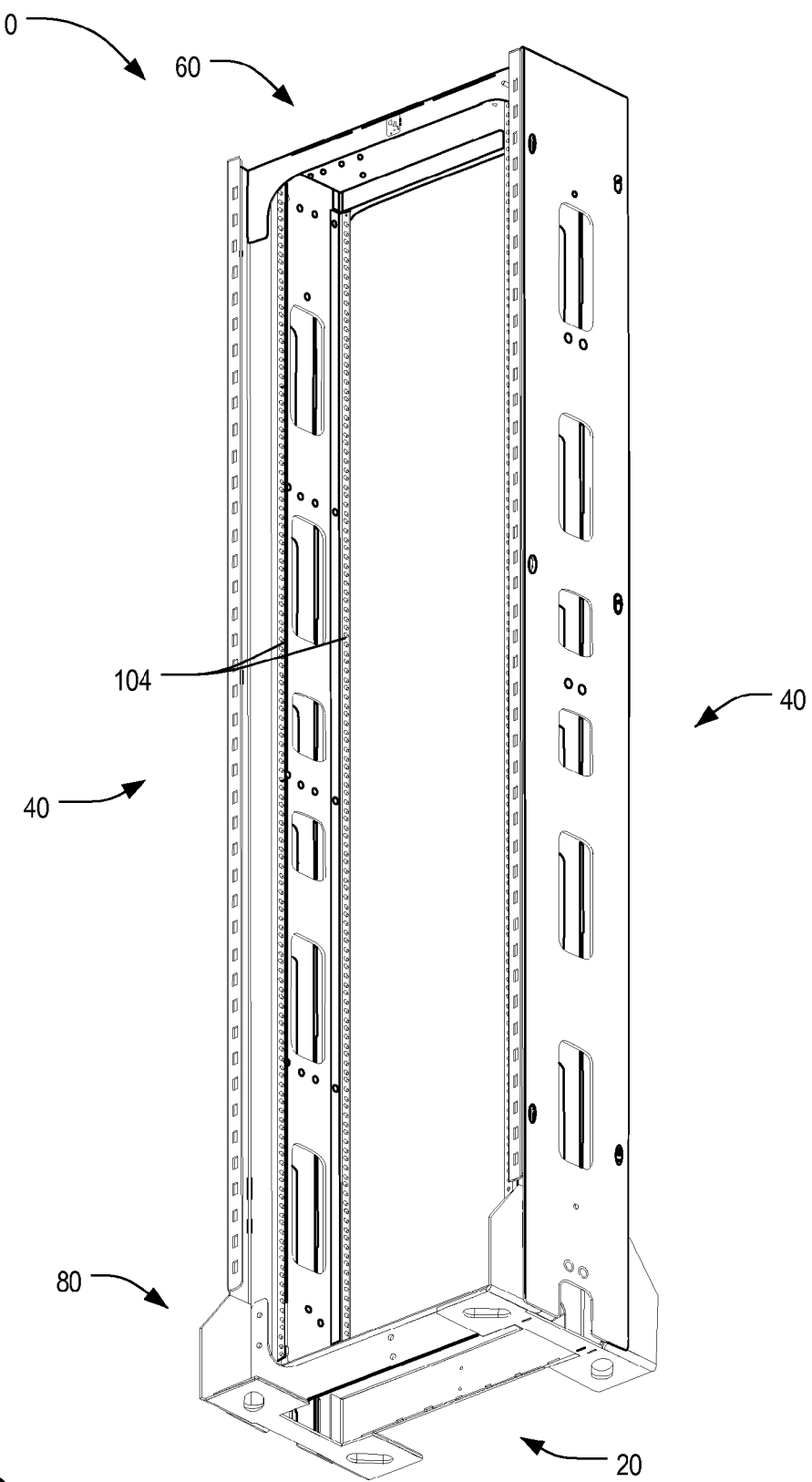
FIG. 2 is a bottom isometric view of the rack of FIG. 1.
Figure 3:
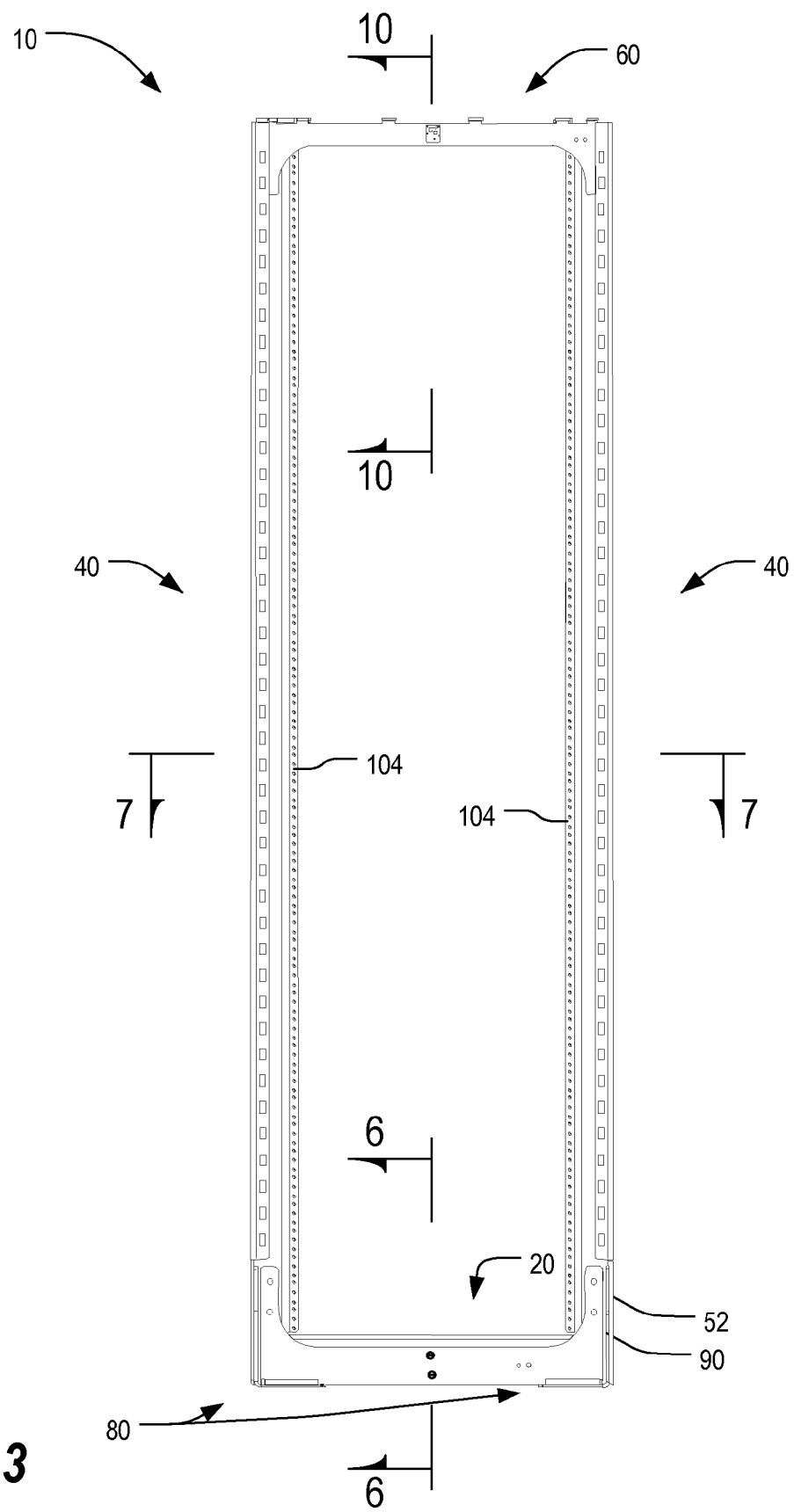
FIG. 3 is a front plan view of the rack of FIG. 1.

FIGS. 1-3 are a top isometric view, a bottom isometric view and a front plan view, respectively, of a two-post mounting rack 10 in accordance with a preferred embodiment of the present invention. As shown therein, the two-post mounting rack 10 includes a frame bottom 20, two frame uprights 40, a frame top 60, a set of vertical mounting rails 104 and a base assembly 80. Each of these will be further described hereinbelow.

Figure 4:
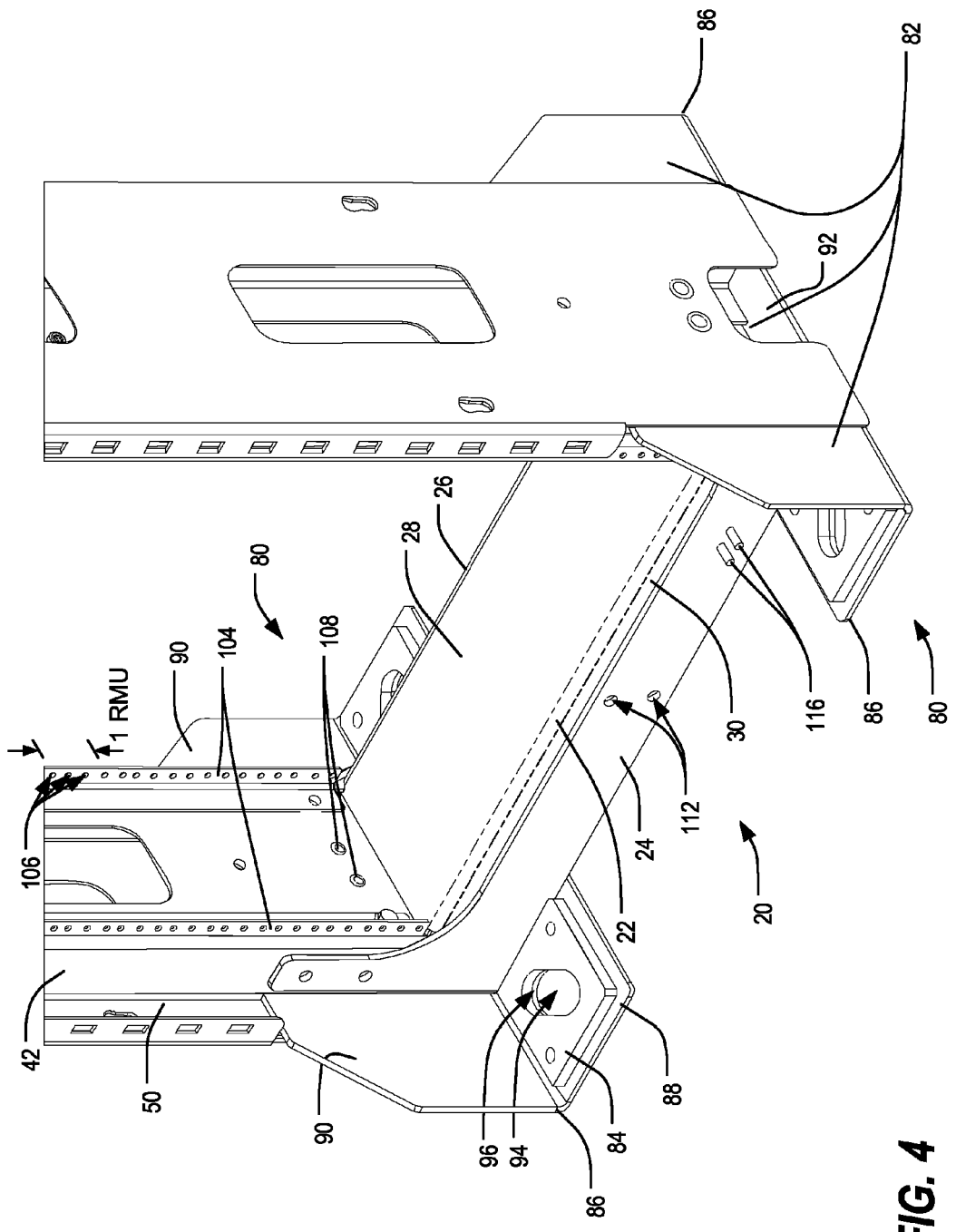
FIG. 4 is an enlarged isometric view of a lower portion of the rack of FIG. 1.
Figure 5:
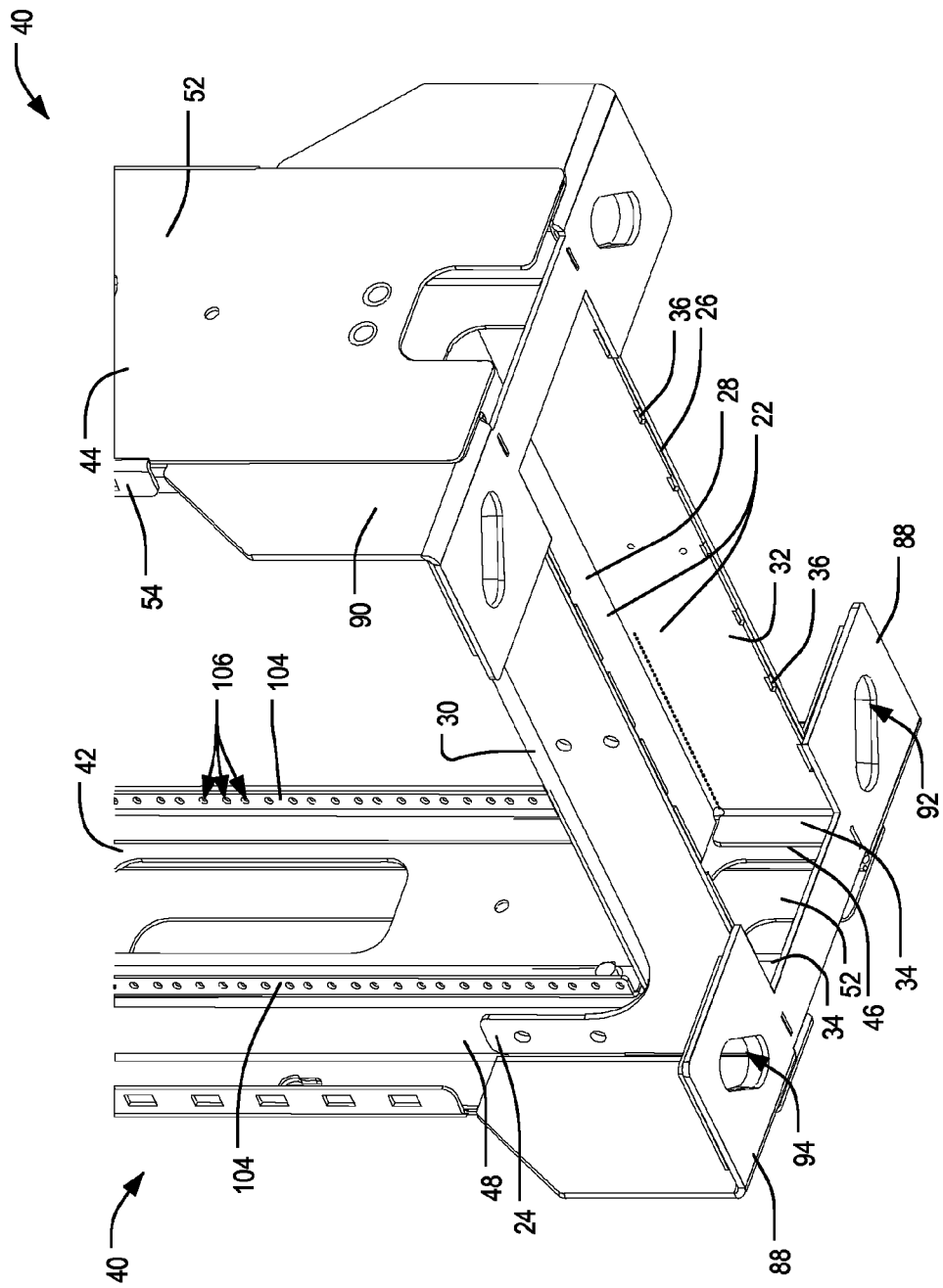
FIG. 5 is an enlarged isometric view of a lower portion of the rack of FIG. 2.
Figure 6:
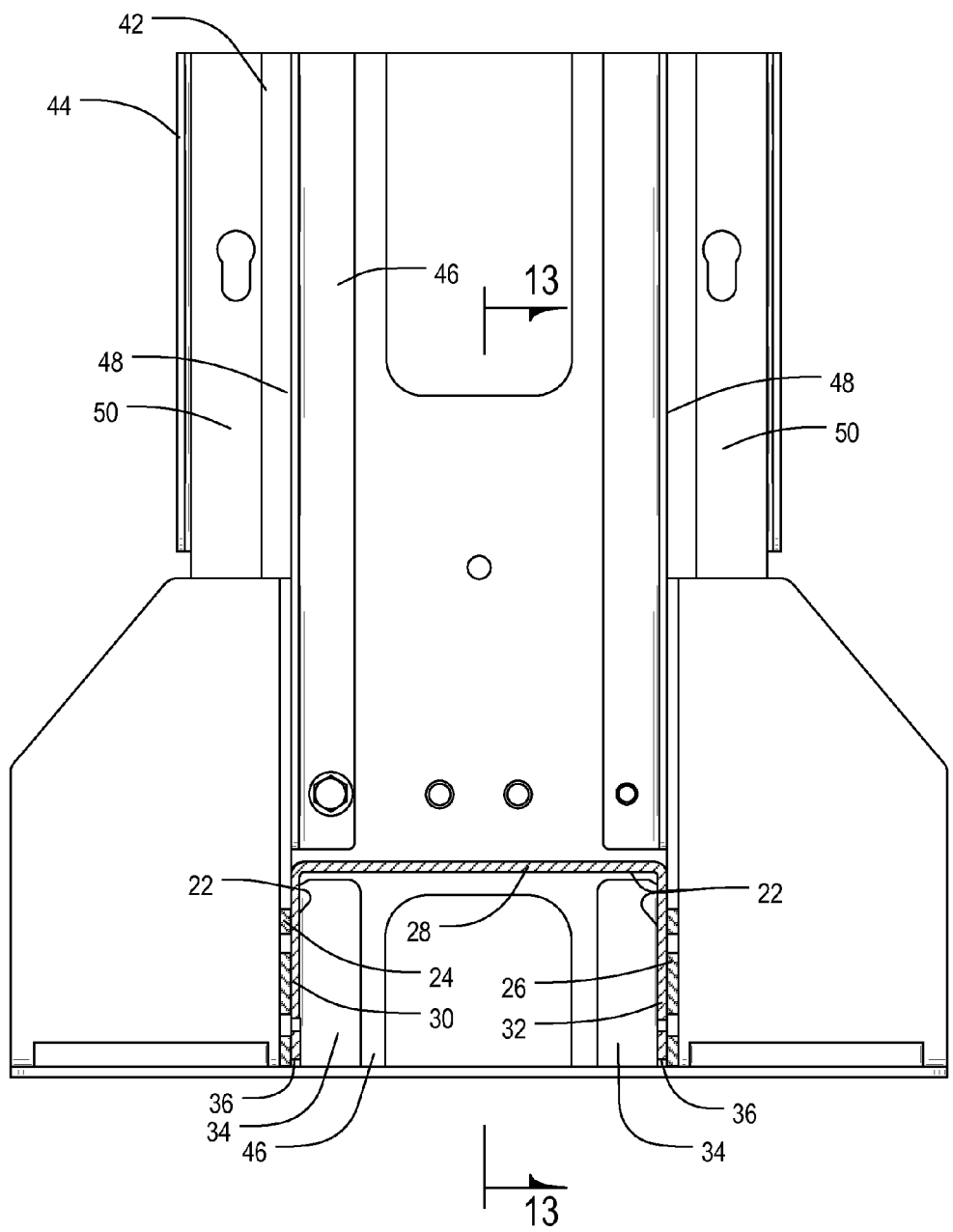
FIG. 6 is a side cross-sectional view of a lower portion of the rack of FIG. 3, taken along line 6-6.

FIG. 4 is an enlarged isometric view of a lower portion of the rack 10 of FIG. 1, FIG. 5 is an enlarged isometric view of a lower portion of the rack 10 of FIG. 2, and FIG. 6 is a side cross-sectional view of a lower portion of the rack 10 of FIG. 3, taken along line 6-6. As shown therein, the frame bottom 20 includes a lower cross-member 22 and two lateral gusset plates 24,26. The lower cross-member 22 is generally U-shaped in cross-section with a top plate 28 and two side plates 30,32. The lower cross-member 22 further includes a tab 34 at each corner, perhaps best shown in FIGS. 5 and 6. Each lateral gusset plates 24,26 is preferably skip welded along its edges to a respective side plate 30,32 of the lower cross-member 22. Notches 36, perhaps best seen in FIG. 5, may be provided along the bottom edges of the side plates 30,32 such that the gusset plates 24,26 may be affixed to the side plates 30,32 via a skip weld along the full length of each notch 36.

Figure 7:
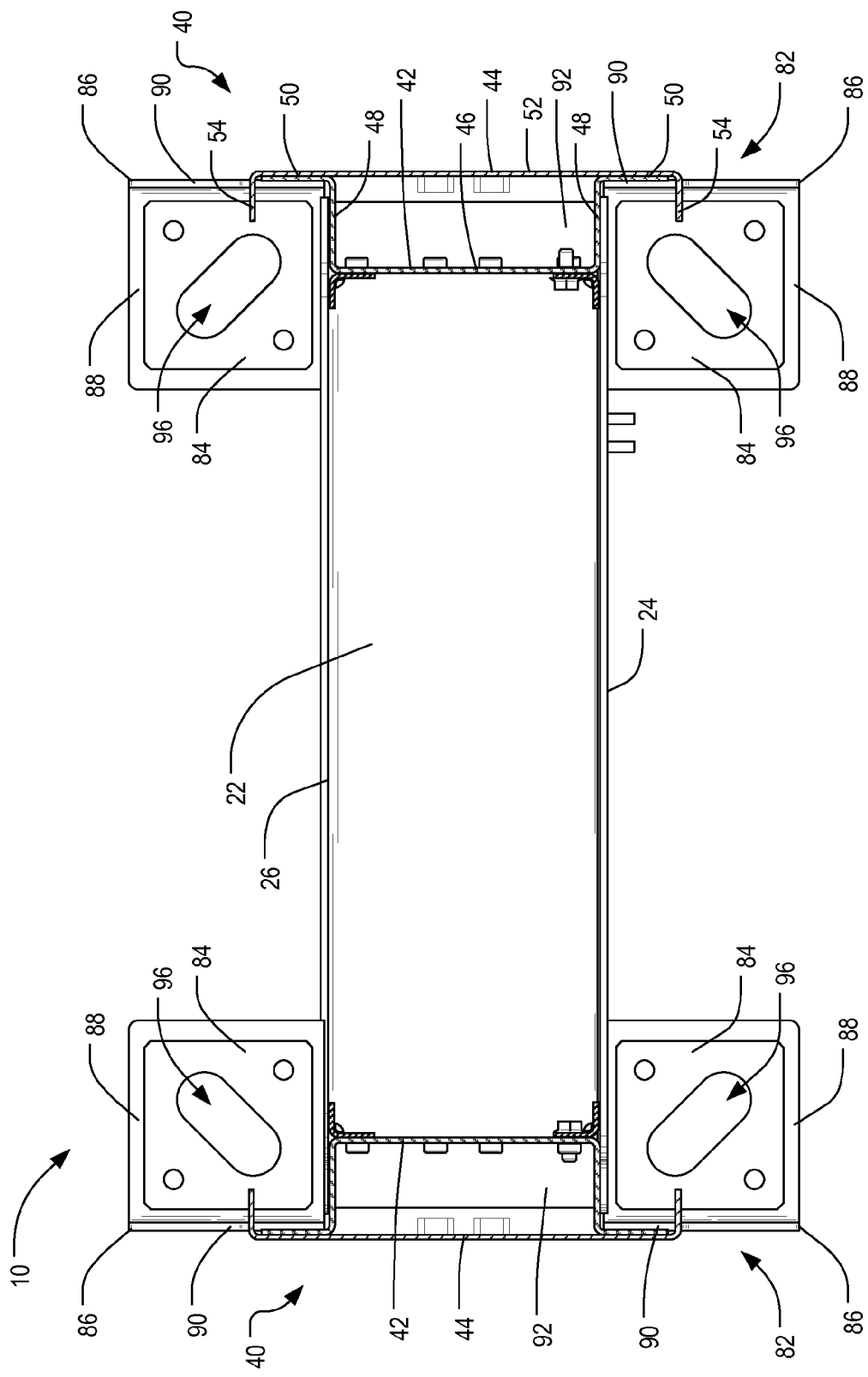
FIG. 7 is a top cross-sectional view of the rack of FIG. 3, taken along line 7-7.

FIG. 7 is a top cross-sectional view of the rack 10 of FIG. 3, taken along line 7-7. As shown therein, each frame upright 40 includes an inner upright member 42 and an outer upright member 44. The inner upright member 42 has a cross-section that is generally in the shape of a "U", formed from a U-base 46 and two U-sides 48, with wings 50 extending laterally from the distal ends of the U-sides 48; i.e., from the top of the "U." The outer upright member 44 has a cross-section that is likewise generally in the shape of a "U", formed from a U-base 52 and two side flanges 54, but the U-base 52 of the outer upright member 44 is dimensioned such that the entire width of the inner upright member 42, including the "U" portion as well as the wing 50, may be accommodated between the side flanges 54 of the outer upright member 44. The inner and outer upright members 42,44 are affixed to each other, preferably at least via spot welding between the wings 50 of the inner upright member 42 and the U-base 52 of the outer upright member 44, to form one continuous closed shaped section which gives the structural strength to endure the severe front-to-back, side-to-side forces that a seismic rack must survive to pass seismic testing. In constructing the rack 10, it is preferred that all components are positioned correctly and secured to prevent any movement during the welding process.

Each frame upright 40 is attached at its lower end to a respective end of the frame bottom 20. In particular, the tabs 34 of the lower cross-member 22, as well as the edges along the ends of the lower cross-member are preferably skip welded to the U-base 46 of the inner upright members 42, the lateral gusset plates 24,26 are preferably plug welded to the U-sides 48 of the inner upright members 42, and the edges of the lateral gusset plates 24,26 are preferably additionally skip welded and continuous welded to the U-sides 48 of the inner upright members 42. Interior corners between the top surface of the top plate 28, the interior surfaces of the gusset plates 24,26 and the interior surfaces of the U-base 46 of the inner upright member 42, one example of which is fully visible in FIG. 4, are preferably fill welded. In constructing the rack 10, it is preferred that all components are positioned correctly and secured to prevent any movement during welding process.

The vertical mounting rails 104, of which there are generally four, may be installed along the inner upright members 42 to facilitate the mounting of electronic equipment and accessories thereto. Such mounting rails 104 may be of conventional construction and preferably each comprises an angle iron having a line of mounting apertures 106 penetrating one member thereof. The mounting apertures 106 are preferably disposed according to a standardized hole-spacing pattern. In this regard, it is well known that the vertical dimension of racks is frequently measured in standardized units. The most common unit of measurement is the "rack mounting unit" ("RMU"). According to accepted standards, an RMU is defined as 1.75 inches in height. Electrical components as well as accessories, which include horizontal raceways, patch panels, and the like, are also commonly measured in RMUs. For example, a 2 RMU component is one which is 3.50 inches or less in height. Thus, a rack which has 45 RMUs may accommodate components and accessories totaling 45 RMUs. Further, to conserve space, components and accessories are frequently installed only at vertical locations corresponding to a whole number of RMUs in order to avoid interfering with adjacent components and accessories. In view of the foregoing, which will be appreciated by the Ordinary Artisan, the mounting apertures 106 are arranged in a pattern that repeats every RMU spacing. Furthermore, the mounting rails 104 on each frame upright 40 may be spaced front-to-back at a spacing that matches conventional spacing, thereby permitting conventional equipment accessories to be used without modification.

Figure 8:
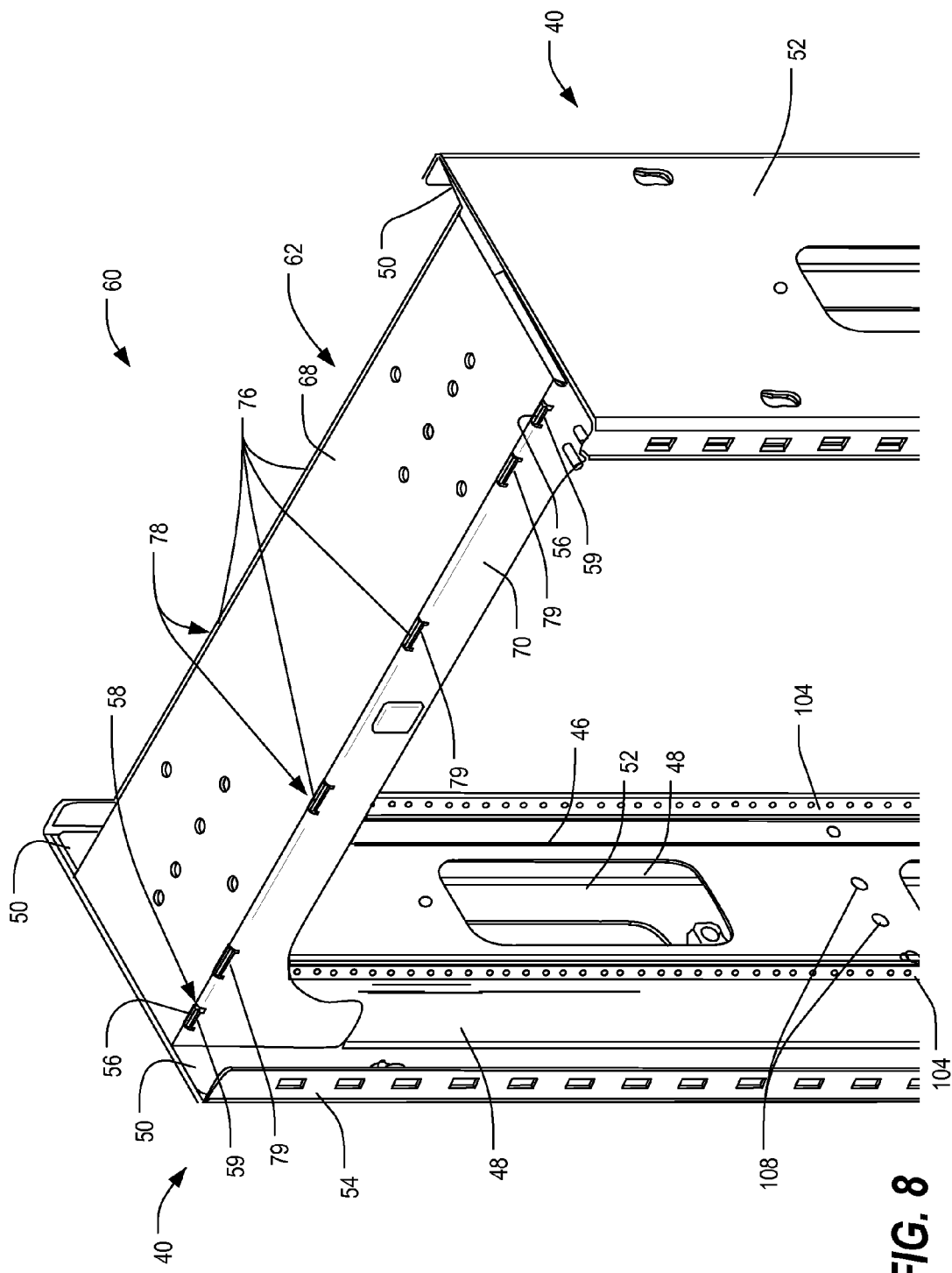
FIG. 8 is an enlarged isometric view of an upper portion of the rack of FIG. 1.
Figure 9:
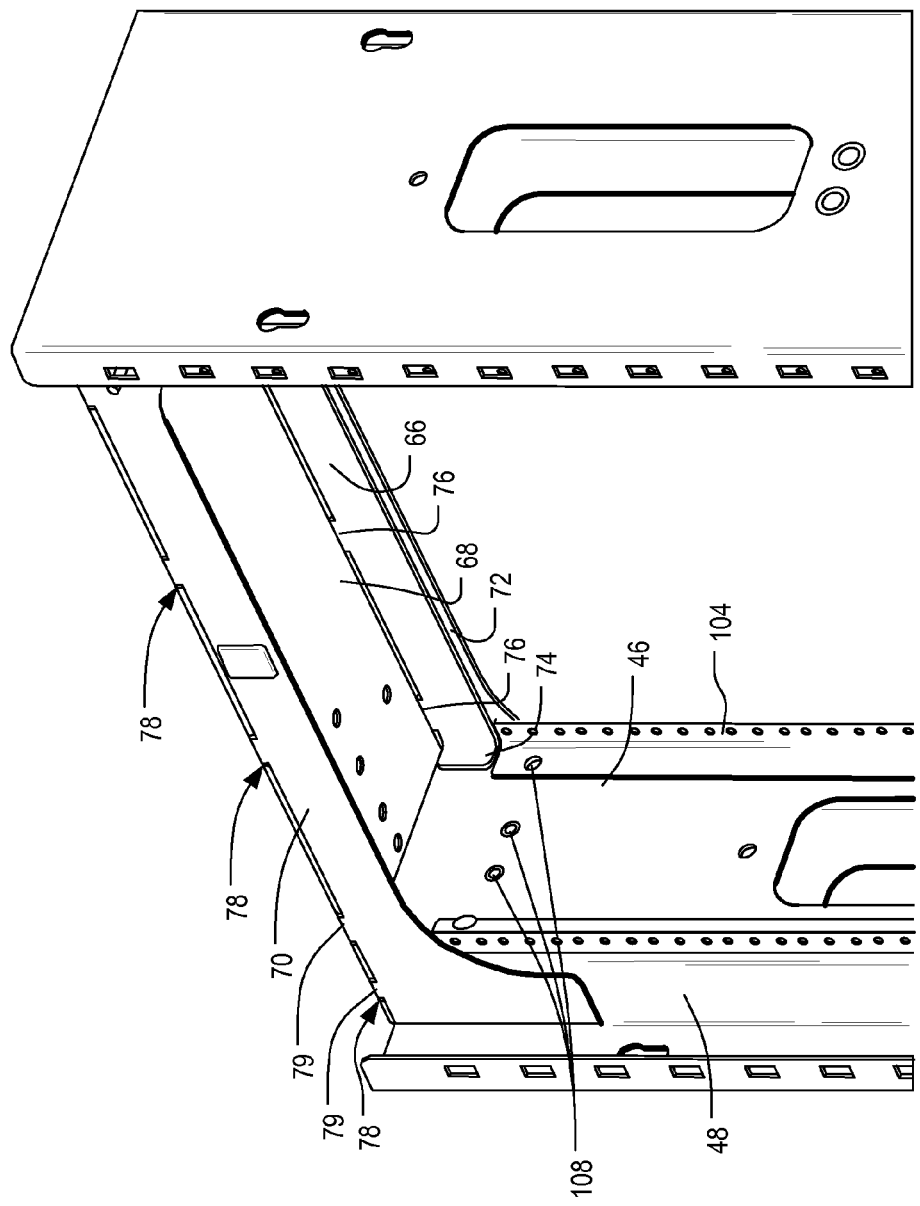
FIG. 9 is an enlarged isometric view of an upper portion of the rack of FIG. 2.

The vertical mounting rails 104 may preferably be attached to the inner upright members 42 via any of several selectable series of mounting openings 108, perhaps best seen in FIGS. 4, 8 and 9. More preferably, four vertical series of mounting openings 108 are provided, with a distance of 1.5 inches between the front-most series and the second series, 1.75 inches between the second series and the third series, and 1.5 inches between the third series and the rear-most series. If the mounting surface of each of the vertical mounting rails 104 is displaced 0.625 inches from the mounting openings used for its mounting, then the mounting surfaces of the vertical mounting rails 104 may be spaced 6 inches (0.625 inches+1.5 inches+1.75 inches+1.5 inches+0.625 inches), 4.5 inches (0.625 inches+1.5 inches+1.75 inches+0.625 inches), 3 inches (0.625 inches+1.75 inches+0.625 inches) or 2.75 inches (0.625 inches+1.5 inches+0.625 inches) apart, depending upon the specific series of openings 108 chosen for the installation location of the mounting rails 104. The inner upright members 42 may be provided with built-in nuts, visible for example in FIG. 7, to facilitate attachment.

Figure 10:
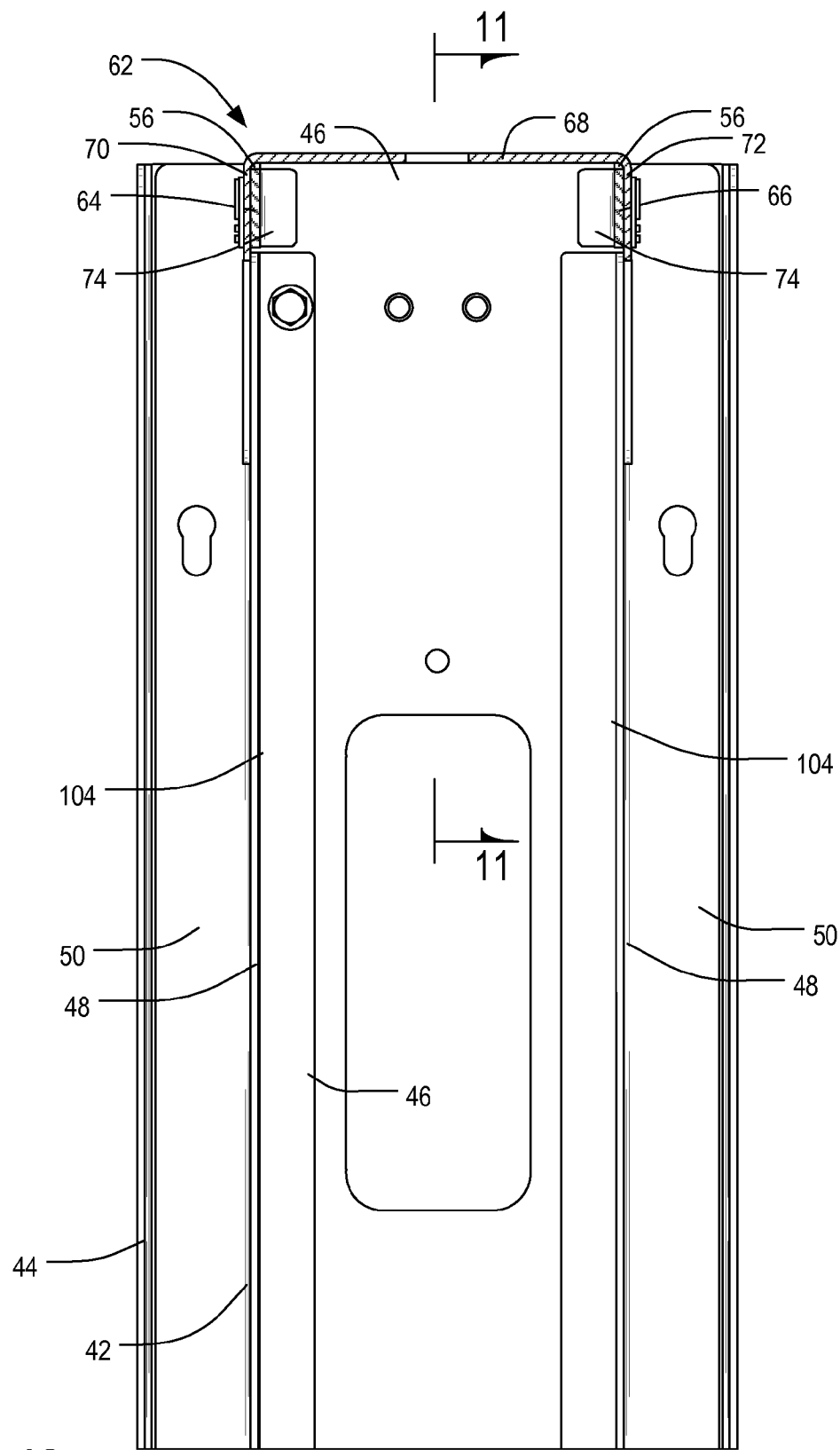
FIG. 10 is a side cross-sectional view of an upper portion of the rack of FIG. 3, taken along line 10-10.
Figure 11:
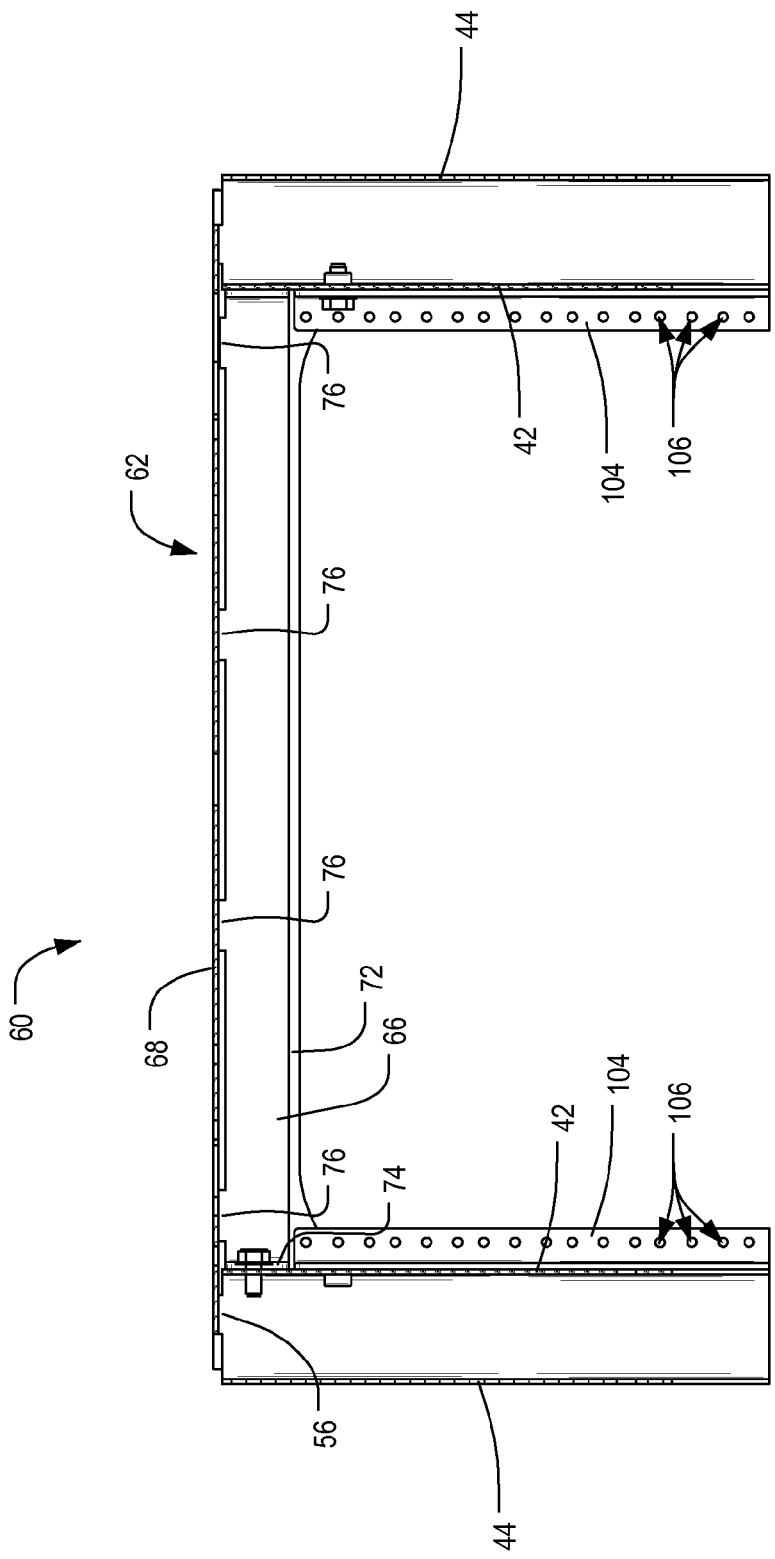
FIG. 11 is a front cross-sectional view of an upper portion of the rack of FIG. 10, taken along line 11-11.

FIG. 8 is an enlarged isometric view of an upper portion of the rack 10 of FIG. 1; FIG. 9 is an enlarged isometric view of an upper portion of the rack 10 of FIG. 2; FIG. 10 is a side cross-sectional view of an upper portion of the rack 10 of FIG. 3, taken along line 10-10; and FIG. 11 is a front cross-sectional view of an upper portion of the rack 10 of FIG. 10, taken along line 11-11. As shown therein, the frame top 60 includes an upper cross-member 62 and two lateral reinforcement plates 64,66. The upper cross-member 62 is generally U-shaped in cross-section with a top plate 68 and two side plates 70,72. Each lateral reinforcement plate 64,66 further includes a mounting tab 74 at each end, perhaps best shown in FIGS. 9 and 10. The frame top 60 is attached at its ends to the upper ends of the frame uprights 40. In particular, the edges of the mounting tabs 74 are preferably skip welded to the U-bases 46 of the inner upright members 42 and the side plates 70,72 of the upper cross-member 62 are preferably additionally skip welded to the U-sides 48 and wings 50 of the inner upright members 42. In constructing the rack 10, it is preferred that all components are positioned correctly and secured to prevent any movement during welding process.

Figure 12:
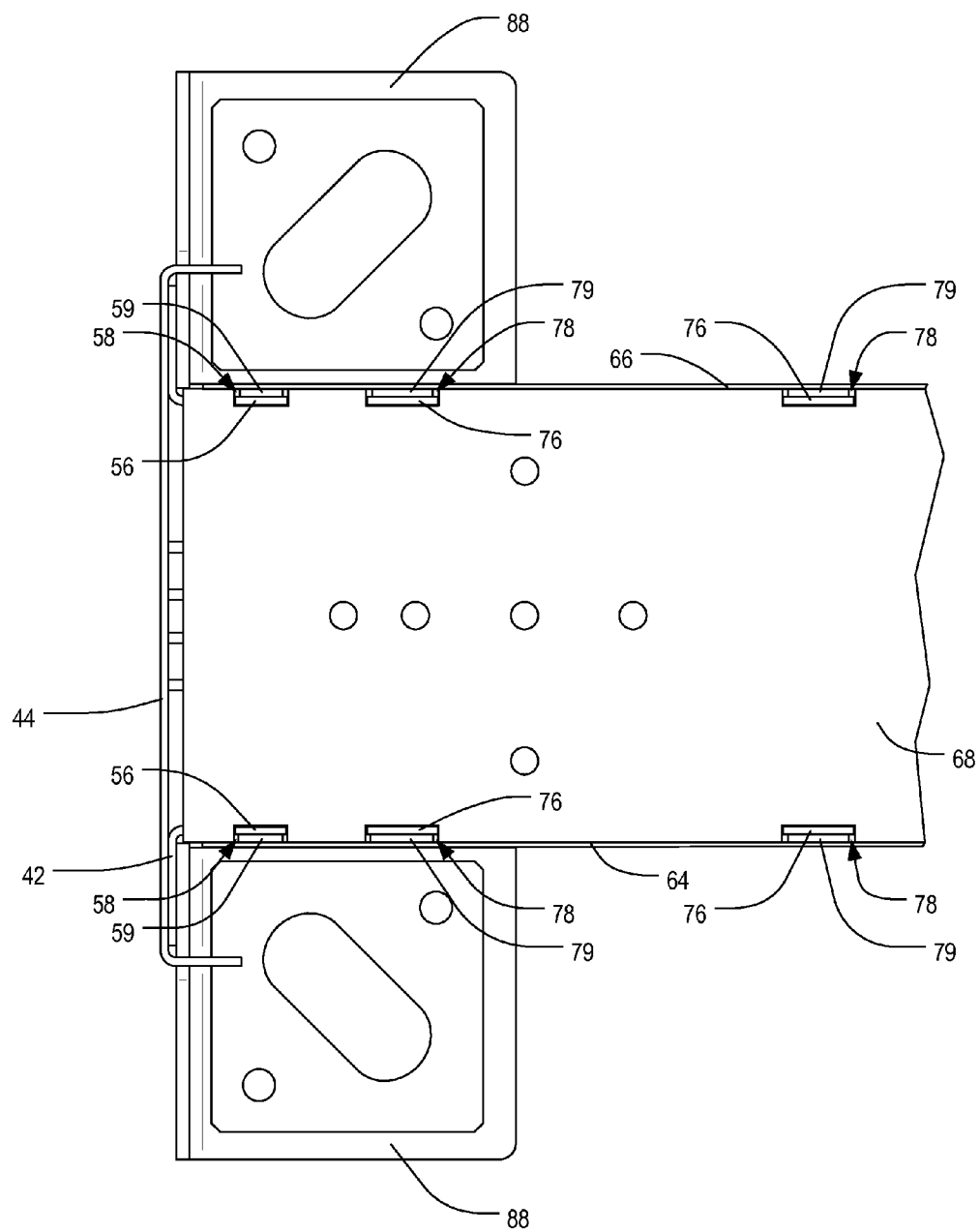
FIG. 12 is an enlarged top plan view of a side portion of the rack of FIG. 1.

FIG. 12 is an enlarged top plan view of a side portion of the rack 10 of FIG. 1. With particular reference to FIGS. 8 and 12, further strength and rigidity is provided by a series of welded, interlocking tabs and slots along the upper cross-member 62, the lateral reinforcement plates 64,66, and the upper end of the inner upright member 42. More particularly, each lateral reinforcement plate 64,66 includes a plurality of tabs 76 along its upper edge, perhaps best shown in FIG. 9. Each tab 76 is arranged to fit into a corresponding slot 78 penetrating the upper cross-member 62 along the intersection between the top plate 68 and one of the side plates 70,72. A tab 56 also extends upward from the upper end of the inner upright member 42 and is arranged to fit into a corresponding slot 58, also penetrating the upper cross-member 62 along the intersection between the top plate 68 and one of the side plates 70,72. The side plates 70,72 of the upper cross-member 62 further include a plurality of doubler tabs 59,79 extending upward therefrom, each arranged to align with a corresponding tab 56,76 when the tab is properly inserted through its corresponding slot 58,78. Each lateral reinforcement plate 64,66 is preferably skip welded along its edges to a respective side plate 70,72 of the upper cross-member 62 and the tabs 56,76 are preferably welded to the upper cross-member 62 and ground smooth. Furthermore, each tab 56,76 is welded to its corresponding doubler tab 59,79. In constructing the rack 10, it is preferred that all components are positioned correctly and secured to prevent any movement during welding process.

Figure 13:
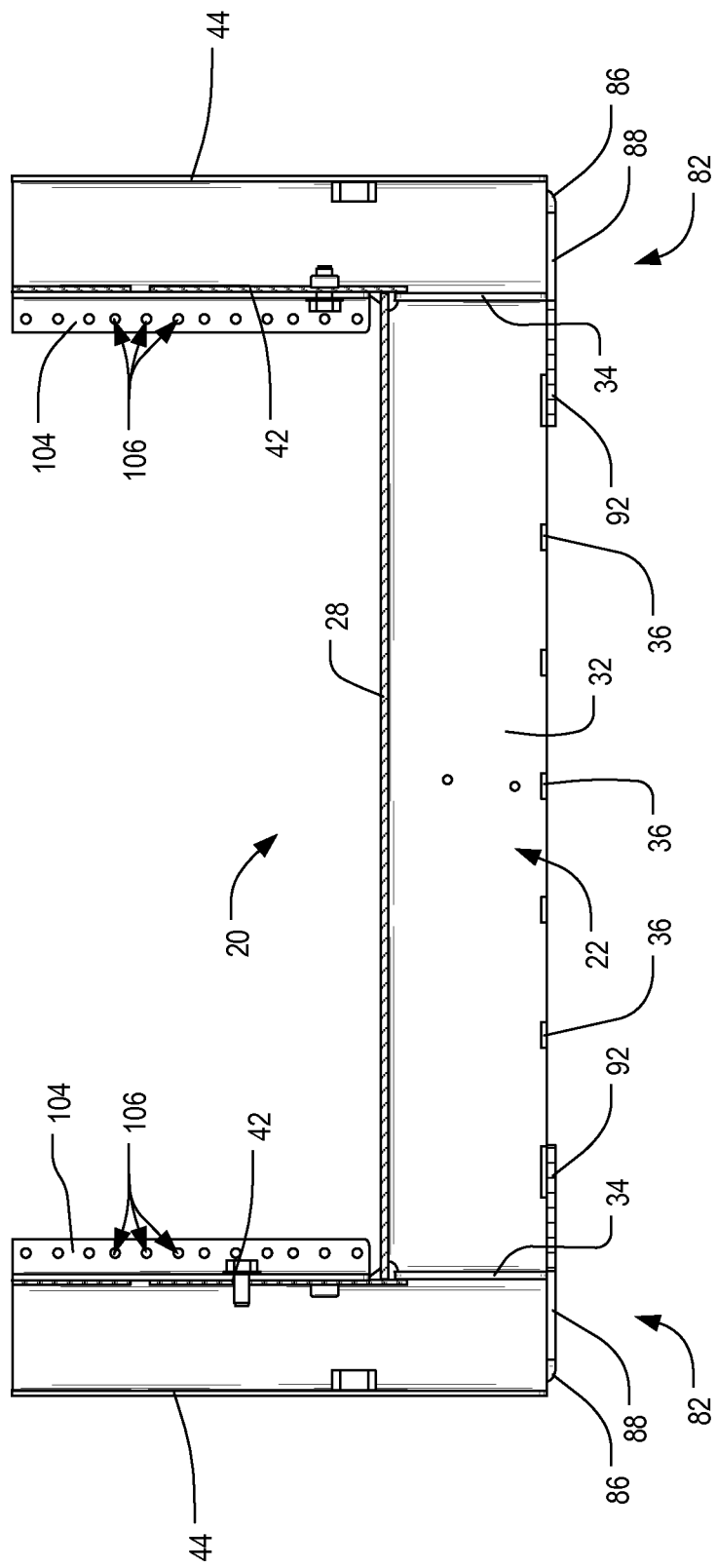
FIG. 13 is a front cross-sectional view of a lower portion of the rack of FIG. 6, taken along line 13-13.

FIG. 13 is a front cross-sectional view of a lower portion of the rack 10 of FIG. 6, taken along line 13-13. With particular reference to FIGS. 4, 7 and 13, the base assembly 80, which with the frame bottom 20 supports the rack 10 on a floor surface (not shown), includes two end gusset members 82 and a plurality of corner anchor plates 84. Each end gusset member 82 includes two corner gussets 86, each including a floor plate 88 and a riser plate 90, connected by a bridge member 92. A slot 94, perhaps best seen in FIG. 5, penetrates the floor plate 88 of each corner gusset 86, and a corresponding slot 96 penetrates each corner anchor plate 84. Each anchor plate 84 is overlaid on top of a respective floor plate 88 such that their slots 96,94 are aligned as shown in FIG. 4. Preferably, the anchor plates 84 are skip welded in place on the floor plates 88 and further plug welded to the floor plates 88, except that in at least some embodiments, no welding occurs between the anchor plates 84 and the gusset plates 24,26. The edge of the cross-members 22 and the edge of the gusset plates 24,26 are all welded together along each of the four lines where these elements come into close proximity.

Each of the frame uprights 40 is attached at its lower end to a respective end of the base assembly 80. In particular, the riser plate 90 of each corner gusset 86 is welded along their upper edge to the wings 50, but in at least some embodiments the riser plates 90 are not directly attached, by welding or any other any means, along their vertical edge to the wings 50 or the U-sides 48. The outer edge of the wings 50, the outer surface of the riser plates 90, and the outer edge of the U-bases 52 are all welded together along the four lines where these elements come into close proximity. The lower edge of the U-bases 52, the lower edge of the wings 50, and the bottom surface of the floor plates 88 are all welded together along the four lines where these elements come into close proximity. In constructing the rack 10, it is preferred that all components are positioned correctly and secured to prevent any movement during the welding process.

Figure 14:
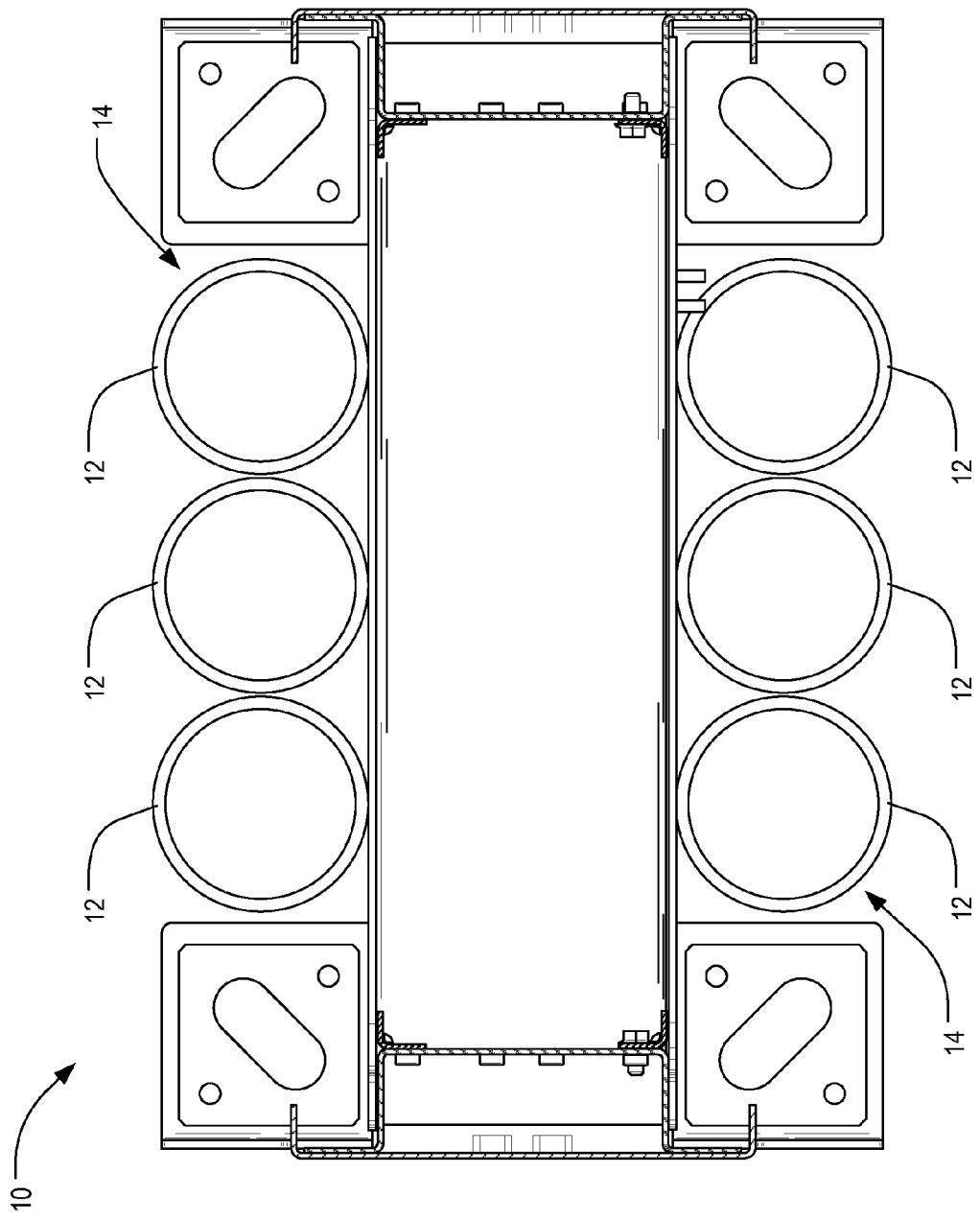
FIG. 14 is a top cross-sectional view, similar to the view of FIG. 7, of the rack of FIG. 3, schematically illustrating the use of conduits to route cables through the floor directly in front of and behind the rack.

FIG. 14 is a top cross-sectional view, similar to the view of FIG. 7, of the rack 10 of FIG. 3, schematically illustrating the use of conduits 12 to route cables through the floor directly in front of and behind the rack 10. Unlike prior art racks, the space 14 between the corner gussets 86 both in front of and behind the rack 10 of the present invention is sufficient to permit a substantial number of cables to be routed therebetween. For example, as illustrated, three cable conduits 12 having a diameter of 4 inches, as is conventional, may be placed side by side in each of the spaces 14 between the corner gussets 86 both in front of and behind the rack 10. Cables from such conduits 12 may be routed through a raised floor beneath the rack 10 and up into the rack 10 itself. Unlike prior art racks, cables may thus be routed through a floor surface beneath the rack 10 within the overall footprint of the rack 10, which is quite advantageous in reducing the amount of floor space consumed in an installation.

Figure 15:
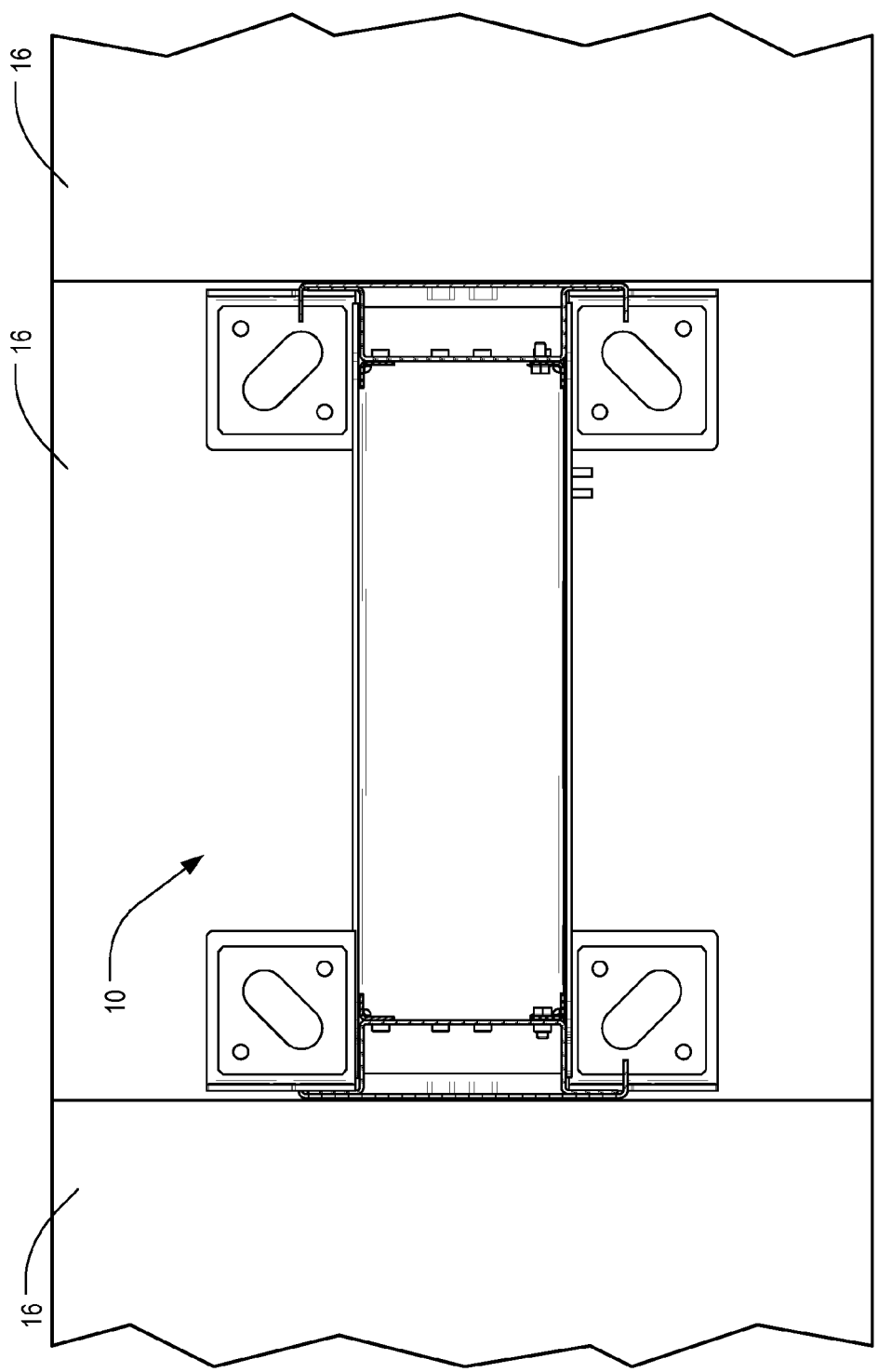
FIG. 15 is a top cross-sectional view, similar to the view of FIG. 7, of the rack of FIG. 3, schematically illustrating the placement of the rack on a raised floor.

FIG. 15 is a top cross-sectional view, similar to the view of FIG. 7, of the rack 10 of FIG. 3, schematically illustrating the placement of the rack 10 on a raised floor. In particular, FIG. 15 illustrates a particular commercial embodiment of the rack of the present invention, of a class of racks known as "19 inch racks," wherein the vertical mounting rails 104 are disposed to accept and support "19 inch" equipment and accessories, a width of 19 inches being very common in conventional commercial two-post racks. The rack is 10 shown placed on a set of four floor tiles 16 comprising a portion of a raised floor. The floor tiles 16 shown are likewise of conventional dimensions, i.e., 24 inches wide and 24 inches long. As will be appreciated, the "19 inch" rack 10 that is illustrated has external dimensions of slightly less than 24 inches (23.920 inches in at least one commercial embodiment) and thus fits easily within the boundaries of a single 24-inch-by-24 inch floor tile 16. Although not illustrated, it will likewise be appreciated that in another particular commercial embodiment of the rack of the present invention, of a class of racks known as "19 inch racks," wherein the vertical mounting rails 104 are disposed to accept and support "23 inch" equipment and accessories, a width of 23 inches being very common in conventional commercial two-post racks, and that the "23 inch" rack has external dimensions of slightly less than 28 inches (27.920 inches in at least one commercial embodiment).

The narrow width of racks 10 constructed according to the designs set forth herein advantageously permits more racks to be installed in the same room space. Perhaps even more advantageously, the narrow width of racks 10 constructed according to the designs set forth herein aids the installer when replacing conventional racks in an existing installation with racks 10 of the present invention, because a replacement rack 10 constructed according to the designs set forth herein may be able to fit in the same footprint of the conventional rack being replaced. This allows the installer to replace a single rack without having to shift or otherwise move an entire row of existing racks merely to accommodate the new rack 10.

It will be further appreciated that a "19 inch" rack may be constructed having a footprint of 23.920 inches wide by 15.00 inches deep, and that a "23 inch" rack may be constructed having a footprint of 27.920 inches wide by 15.00 inches deep. The distance between the floor plates 88 on both the front and rear of such a "19 inch" rack is preferably at least 12 inches, and more preferably at least 14 inches, thereby permitting three conduits or cable bundles at least 4 inches wide (or 4 inches in diameter) to be placed side by side between the floor plates 88, and that the distance between the floor plates 88 on both the front and rear of such a "23 inch" rack is preferably at least 16 inches, and more preferably at least 18 inches, thereby permitting four conduits or cable bundles at least 4 inches wide (or 4 inches in diameter) to be placed side by side between the floor plates 88. In at least one preferred embodiment, the distance between the floor plates 88 on both the front and rear of a "19 inch" rack is 14.10 inches, and the distance between the floor plates 88 on both the front and rear of a "19 inch" rack is 18.10 inches.

The overall rigidity of the rack 10 is significantly enhanced through the use of gussets and other reinforcing layers to transfer forces from one structural element to another, but manufacturability is enhanced and material lists are reduced through use in most or all places of only a single reinforcing layer to accomplish such transference. Examples include the upper cross-member 62 reinforced with the reinforcement plates 64,66 and transference of forces between the upper cross-member 62 and inner upright member 42 via the reinforcement plates 64,66, the lower cross-member 22 reinforced with the lateral gusset plates 24,26 and the transference of forces between the lower cross-member 22 and the inner upright member 42 via the lateral gusset plates 24,26 and the tabs 34, the inner upright member 42 reinforced with the outer upright members 44 and the transference of forces between the frame uprights 40 and the gusset members 82, and the gusset floor plates 88 reinforced with the corner anchor plates 84 and the transference of forces between the frame uprights 40 and the floor via the gusset risers 90 and the gusset floor plates 88.

Figure 16:
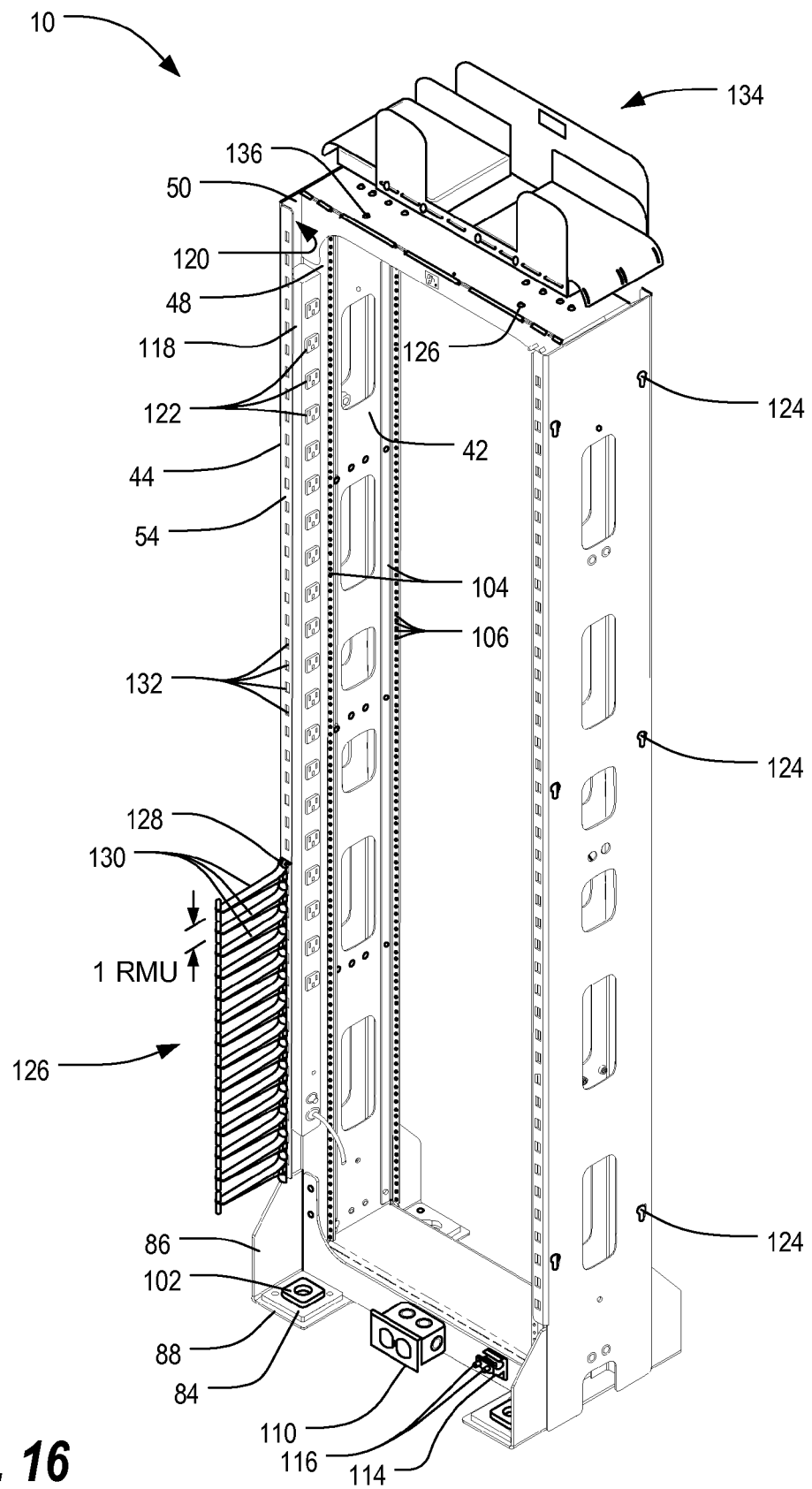
FIG. 16 is a top isometric view of the rack of FIG. 1, illustrating various optional features and accessories of the rack.

FIG. 16 is a top isometric view of the rack 10 of FIG. 1, illustrating various additional features and components that may be used with the rack 10. In one additional feature or component example, the rack 10 may be anchored to the floor beneath the rack 10 using appropriate floor anchors (not shown), which in at least some embodiments are seismically-rated floor anchors. Such anchors conventionally use a washer 102 or similar structure, shown added on top of the anchor plate 84 and floor plate 88 of each corner gusset 86 in FIG. 16. Such a washer structure 102 may prevent damage to the anchor and floor plates 84,88 and may prevent a tie-down bolt or other floor anchor from twisting through the slots 96,94 if one or more structure is damaged during a seismic event.

In another additional feature or component example, a generally-conventional two-plug power outlet 110 may be attached to the bottom of the rack 10 to provide a power source for electronic equipment, accessories, and the like (not shown) mounted or supported in or on the rack 10. Mounting apertures 112, visible in FIG. 4 and penetrating both each lateral gusset plate 24,26 and a respective side plate 30,32 of the lower cross-member 22, may be used to attach the outlet 110 to the frame bottom 20.

In another additional feature or component example, a ground terminal block 114, sometimes referred to as a "ground lug," may be mounted on studs 116 at the top or bottom of the rack 10.

In another additional feature or component example, a power strip 118 may be mounted in a channel 120 created between any of the U-sides 48 of the inner upright members 42, the inner upright member wing 50 adjacent to it and the corresponding outer upright member side flange 54 adjacent to it. The power strip 118 may be of any desired length (height) in order to provide industry standard power outlets 122 at convenient locations accessible to electronic equipment (not shown) mounted in the rack 10. The power strip 118 may be mounted in the channel 120 for quick and easy removal through use of conventional bolts or the like on the back thereof, arranged to be inserted through, and supported by, keyhole openings 124 penetrating the wings 50 of the inner upright members 42 and the U-base 52 of the outer upright members 44, such openings 124 being arranged at appropriate locations along the length thereof. The power strip 118 itself may be powered by plugging its power cord into one of the outlets in the two plug-power outlet 110 provided at the bottom of the rack 10.

Seismically hardening a two-post electronic equipment rack, such as the rack 10 described and illustrated herein, may be particularly useful when power outlets, such as the two plug-power outlet 110 and power strip 118 shown in FIG. 16, are mounted directly thereon, because of the importance of maintaining safe electrical connections during the occurrence of a seismic event. By maintaining the structural integrity of the rack, the physical relationship between equipment and accessories and the outlets into which they are plugged may likewise be preserved. Such integrity may be preserved by using the seismically hardened two post rack 10 in accordance with one or more preferred embodiments of the present invention.

In another additional feature or component example, one or more cable guides 126 may be mounted on the side flanges 54 of the outer upright members 44 of the rack 10. Each cable guide 126 includes a linear projection support bracket 128 and a plurality of T-shaped projections 130 forwardly extending therefrom. The projection support bracket 128 has a plurality of evenly-spaced resilient plug mounts (not illustrated), extending rearward from the back thereof, that are adapted to mate with rectangular apertures 132 in the side flanges 54 of the outer upright members 44. The cable guide 126 may be mounted on a side flange 54 by aligning the plug mounts with the rectangular apertures 132 in the side flanges 54 and then inserting them through the apertures 132 such that one or more resilient features on the plug mounts are deflected and then spring back into place as the plug mounts become fully seated in the rectangular apertures 132. Bosses are preferably disposed on the plug mounts to maintain the plug mounts, and thus the cable guides 126, in place.

Each T-shaped projection 130 includes a reinforced base, a shaft and a crosspiece. Each pair of adjacent T-shaped projections 130 defines a cable ring formed by the respective bases, shafts and crosspieces of the projections 130 and the body of the projection support bracket 128. An opening into each cable ring is provided by a gap between the ends of the crosspieces of each pair of adjacent projections 130. This gap permits cables to be inserted into the ring by passing them sideways through the gap.

The respective projections 130 are evenly spaced along the length of the cable guide 126 at a standardized spacing. In the embodiment shown and described, the spacing between the respective projections 130 is equal to a single standard rack mounting unit ("RMU"), but it should be obvious that other standard spacings could be used such as spacings measured in alternative units or spacings which are multiples of the RMU. By using such a standard spacing, it is ensured that a cable ring is disposed at, and dedicated to, each RMU along the height of a rack 10. Benefits of this, and further applicable details of the T-shaped projections, cable rings, and the like, are described in, or made apparent by, the aforementioned U.S. Pat. No. 7,119,282 to Krietzman, et al.

Because the cable guide 126 is formed separately from the side flanges 54 and subsequently attached thereto, rather than being formed integrally therewith, the cable guide 126 may be formed from a different material than the side flanges 54. Thus, although the side flanges 54 may preferably be formed from metal, the cable guides 126 may be injection-molded from plastic in order to create rounded or beveled edges along the edges of the T-shaped projections 130. The rounded edges of the cable rings do not chafe cables inserted therein like the sharp metal edges of prior art raceways would, while the rounded edges and corners of the edges of the ends of the crosspieces enable cables being installed in the cable rings to be smoothly guided through the gaps. In addition, by forming the shafts of the projections 130 from plastic rather than from sheet metal, the width of the shafts may be reduced while still providing the requisite strength and resiliency, thus allowing the cable rings to be widened considerably relative to the width of the shafts. As a result, each cable ring includes a C-shaped opening having concave top and bottom portions and a narrow entry gap relative to the width and height of the ring, thus maximizing the utility of the cable ring in receiving while still retaining a large number of cables. It will be appreciated, however, that other types of cable guides may likewise be utilized without departing from the scope of one or more aspects of the present invention.

In another additional feature or component example, a cable raceway, runway, trough, or other raceway devices may be mounted to the top of the rack 10. As is well known to the Ordinary Artisan, cables may be routed horizontally through such raceway devices to and from other raceway devices mounted on other racks or cabinets, suspended from the ceiling, or the like. In many implementations, cables may further be routed from such raceway devices downward toward electronic equipment and routing accessories mounted in the rack, including the cable guides 126 described previously. One such raceway assembly 134 is illustrated in FIG. 16 and may be mounted to the upper cross-member 62 via mounting apertures 136 such as those illustrated in FIG. 16. Such a raceway assembly 134 may be centered front-to-back on the rack 10 or may be offset a desired distance forward or backward relative to the rack 10. Such adjustability may be facilitated by providing multiple rows of mounting apertures 136, one of which is centered front-to-back, at least one of which is arranged forward of the centered row, and at least one of which is arranged rearward of the centered row. Modular raceways, relevant details of which may be described in the aforementioned U.S. Pat. No. 6,394,398 may be utilized to route cables from the top of one rack 10 to another rack.

Seismically hardening a two-post electronic equipment rack, such as the rack 10 described and illustrated herein, may be particularly useful when used in conjunction with cable raceway devices, such as the raceway assembly 134 shown in FIG. 16, because the collapse of a rack on which such raceway devices are supported may likewise cause the collapse of large portions of adjacent cable support structures because of the sudden shift in weight of cables mounted thereon. Such a collapse may likewise affect adjacent racks and cabinets, thereby exacerbating the sudden and irregular forces already placed on them more directly by a seismic event. Such a collapse may be prevented by using the seismically hardened two post rack 10 in accordance with one or more preferred embodiments of the present invention.

Figure 17:
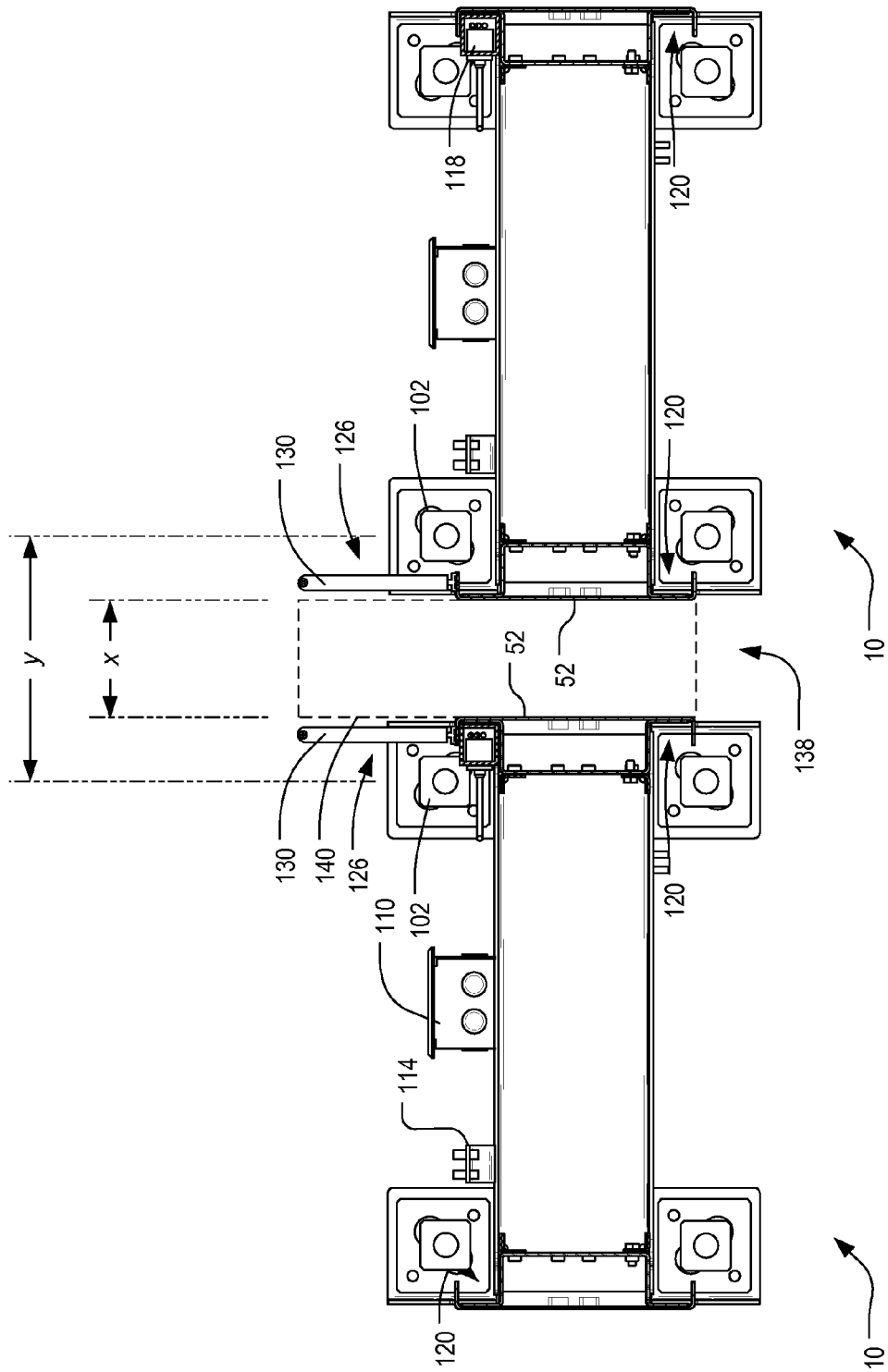
FIG. 17 is a top cross-sectional view, similar to the view of FIG. 7, of two racks like that of FIG. 3, schematically illustrating the creation of a virtual vertical cable manager between the two racks.
Figure 18:
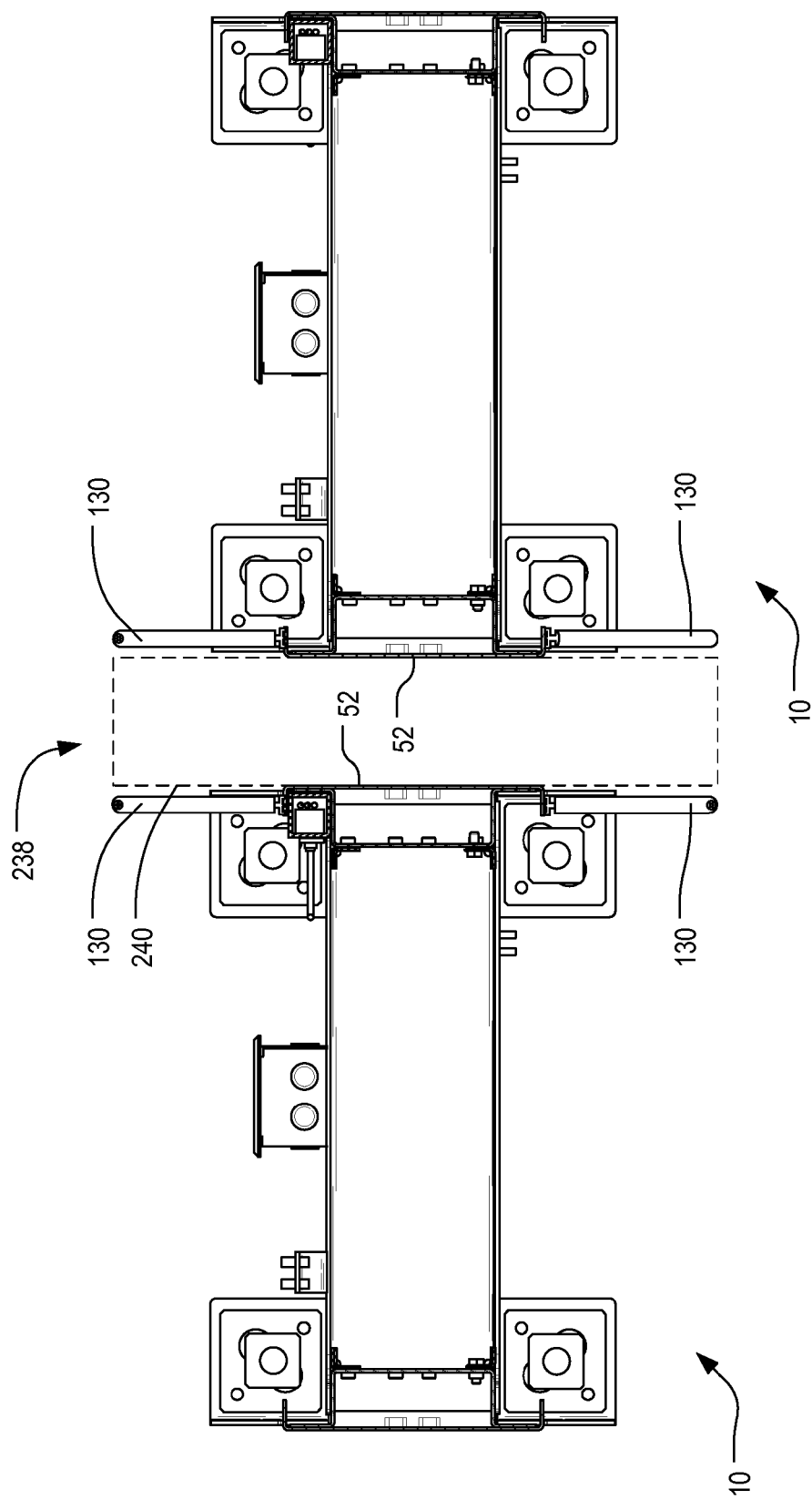
FIG. 18 is a top cross-sectional view, similar to the view of FIG. 7, of two racks like that of FIG. 3, schematically illustrating the creation of another virtual vertical cable manager between the two racks.

FIG. 17 is a top cross-sectional view, similar to the view of FIG. 7, of two racks 10 like that of FIG. 3, schematically illustrating the creation of a virtual vertical cable manager 138 between the two racks 10, and FIG. 18 is a top cross-sectional view, similar to the view of FIG. 7, of two racks 10 like that of FIG. 3, schematically illustrating the creation of another virtual vertical cable manager 238 between the two racks 10. In particular, a virtual vertical cable manager 138, 238 is defined and created by the U bases 52 of adjacent outer upright members 44 on two different racks 10 and the cable management projections 130 mounted thereon. These elements create a virtual vertical cable management channel 140,240 through which cables (not shown) may be routed in like manner to conventional vertical cable managers, including those described in the aforementioned U.S. Provisional Patent Application No. 61/020,745. It will be appreciated that doors, spools and other features may likewise be added to the structure to provide further functionality.

The space created, i.e., the virtual vertical cable management channel 140,240, has a minimum width of x inches, which in the illustrated embodiment is defined as the distance between the outer surfaces of the respective U bases 52. It will be appreciated that the actual cross-sectional shape of the space is dependent on the exact structures, dimensions and the like selected or used to create the space. Such a distance is often mandated by concrete floor anchor standards, which in at least some localities dictate that floor anchors must be some at least some minimum distance y apart to avoid tearing chunks of concrete out during a seismic event. In particular, for a rack 10 constructed according the designs described and illustrated herein, floor anchors must, in at least some localities, be at least 9.5 inches apart, thereby creating considerable space between adjacent racks 10.

It will be appreciated that in some embodiments, virtual vertical cable managers may likewise be created between two-post mounting racks that are not seismically hardened without departing from the scope of the present invention.

The use of virtual vertical cable managers 138,238 permits vertical cable management to be accomplished without necessitating the purchase of an actual vertical cable manager component, thereby providing cost savings, flexibility, ease of installation, and the like. It is also possible to convert between a single-sided virtual vertical cable manager 138 (as shown in FIG. 17) and a double-sided virtual vertical cable manager 238 (as shown in FIG. 18) merely by adding (or removing) projections 130 or the like. Furthermore, unlike conventional vertical cable managers, there is no need for a structural support panel or cross-members within the virtual vertical cable manager 138,238 to provide structural strength. This improves the front-back cable pass-through management since an installer no longer needs to thread cables through designated pass-through openings. Also, this invention allows the middle panel to be non-structural if a customer wants to have a panel or divider to separate a front channel and a back channel. The panel can be made out of non-structural material such as wire, plastic, tubular, thin sheet metal, or the like. This opens up a window of great flexibility of cable management within the vertical cable manager.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A seismically hardened two-post mounting rack comprising:
    (a) a frame bottom;
    (b) a frame top;
    (c) a pair of frame uprights interconnected between the frame bottom and the frame top, each frame upright being formed from an inner channel member mounted to an outer channel member, which, together, define a closed cross-sectional shape, wherein:
        (i) each of the inner and outer channel member has a generally U-shaped cross section;
        (ii) the inner channel member has wings extending outwardly at either side of the U-shape of the inner channel member at an angle that is generally perpendicular to opposing sides of the U-shape; and
        (iii) the wings are mounted to an interior base of the U-shape of the outer channel member to define the closed cross-sectional shape;
        (iv) wherein the inner channel member is affixed to the outer channel member along substantially the entire vertical extent thereof, including at least a bottommost portion of the outer channel member; and
    (d) a base assembly, for supporting the frame bottom on a surface, including two separate end gusset members, each of which includes at least one vertically-oriented riser plate that is attached to at least one of the inner channel member and the outer channel member of a respective one of the frame uprights at a location, along a respective one of the frame uprights, where the wings of the inner channel member are mounted to the interior base of the U-shape of the outer channel member to define the closed cross-sectional shape, thereby imparting additional strength to the connections between the frame bottom and the frame uprights.

2. The seismically hardened two-post mounting rack of claim 1, wherein each end gusset member includes at least one horizontally-oriented floor plate with an anchor plate attached thereto.

3. The seismically hardened two-post mounting rack of claim 2, wherein the floor plate and the anchor plate each have a slot therein that are aligned with one another.

4. The seismically hardened two-post mounting rack of claim 1, wherein the end gusset members each include a bridge member.

5. The seismically hardened two-post mounting rack of claim 1, wherein the closed cross-sectional shape is fabricated by welding together the inner channel member and the outer channel member.

6. The seismically hardened two-post mounting rack of claim 1, further comprising a power outlet attached to the frame bottom.

7. The seismically hardened two-post mounting rack of claim 1, further comprising a power strip attached to at least one of the frame uprights.

8. The seismically hardened two-post mounting rack of claim 1, further comprising a cable raceway attached to the frame top.

9. The seismically hardened two-post mounting rack of claim 1, further comprising a flange member attached to and extending along an edge of at least one of the pair of frame uprights.

10. The seismically hardened two-post mounting rack of claim 9, further comprising a cable guide, mounted to the flange member, and including a plurality of cable management projections extending away from the corresponding frame upright within a space defined by the distance between the pair of frame uprights.

11. The seismically hardened two-post mounting rack of claim 10, wherein each cable management projection includes a base, a shaft and a crosspiece.

12. The seismically hardened two-post mounting rack of claim 11, wherein adjacent cable management projections define a cable ring formed by the respective bases, shafts and crosspieces.

\* \* \* \* \*